(12) United States Patent
Tuncer

(10) Patent No.: US 12,170,164 B2
(45) Date of Patent: Dec. 17, 2024

(54) INTEGRATED HIGH VOLTAGE ELECTRONIC DEVICE WITH HIGH RELATIVE PERMITTIVITY LAYERS

(71) Applicant: Texas Instruments Incorporated, Dallas, TX (US)

(72) Inventor: Enis Tuncer, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 395 days.

(21) Appl. No.: 17/546,287

(22) Filed: Dec. 9, 2021

(65) Prior Publication Data

US 2023/0187121 A1   Jun. 15, 2023

(51) Int. Cl.

| | | |
|---|---|---|
| H01F 27/32 | (2006.01) | |
| H01F 27/02 | (2006.01) | |
| H01F 27/28 | (2006.01) | |
| H01F 41/04 | (2006.01) | |
| H01L 23/495 | (2006.01) | |
| H01L 23/522 | (2006.01) | |
| H01L 23/58 | (2006.01) | |
| H01L 25/00 | (2006.01) | |
| H01L 25/18 | (2023.01) | |

(52) U.S. Cl.
CPC ......... *H01F 27/323* (2013.01); *H01F 27/022* (2013.01); *H01F 27/2804* (2013.01); *H01F 41/043* (2013.01); *H01L 23/49575* (2013.01); *H01L 23/5227* (2013.01); *H01L 23/58* (2013.01); *H01L 25/50* (2013.01); *H01F 2027/2809* (2013.01); *H01L 23/49555* (2013.01); *H01L 25/18* (2013.01)

(58) Field of Classification Search
CPC .. H01F 27/323; H01F 27/022; H01F 27/2804; H01F 41/043; H01F 2027/2809; H01L 23/49575; H01L 23/5227; H01L 23/58; H01L 25/18
See application file for complete search history.

(56) References Cited

U.S. PATENT DOCUMENTS

| | | |
|---|---|---|
| 10,770,378 B1 | 9/2020 | Tuncer |
| 2017/0278811 A1 | 9/2017 | Suga et al. |
| 2020/0076512 A1 | 3/2020 | O'Sullivan et al. |
| 2020/0211961 A1 | 7/2020 | Khanolkar |

FOREIGN PATENT DOCUMENTS

| | | |
|---|---|---|
| WO | 2014112179 | 7/2017 |

OTHER PUBLICATIONS

European Search Report mailed Apr. 27, 2023, Application No. 22210298.0-1212, 2 pages.

*Primary Examiner* — Samuel A Gebremariam
(74) *Attorney, Agent, or Firm* — Ronald O. Neerings; Frank D. Cimino

(57) ABSTRACT

A magnetic assembly includes a multilevel lamination or metallization structure with a core dielectric layer, dielectric stack layers, a high permittivity dielectric layer, and first and second patterned conductive features, the dielectric stack layers having a first relative permittivity, the high permittivity dielectric layer extends between and contacting the first patterned conductive feature and one of the dielectric stack layers or the core dielectric layer, the high permittivity dielectric layer has a second relative permittivity, and the second relative permittivity is at least 1.5 times the first relative permittivity to mitigate dielectric breakdown in isolation products.

17 Claims, 17 Drawing Sheets

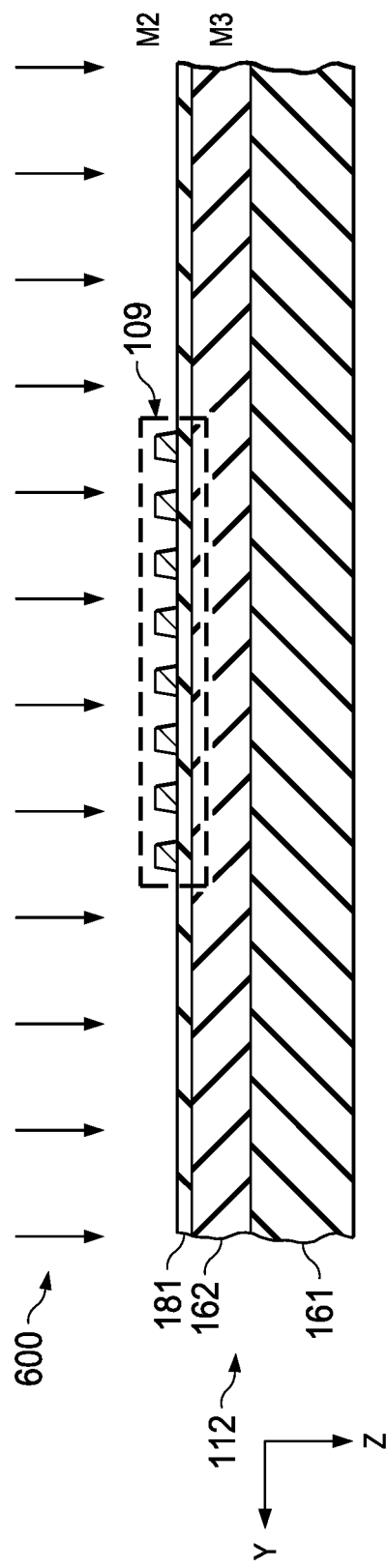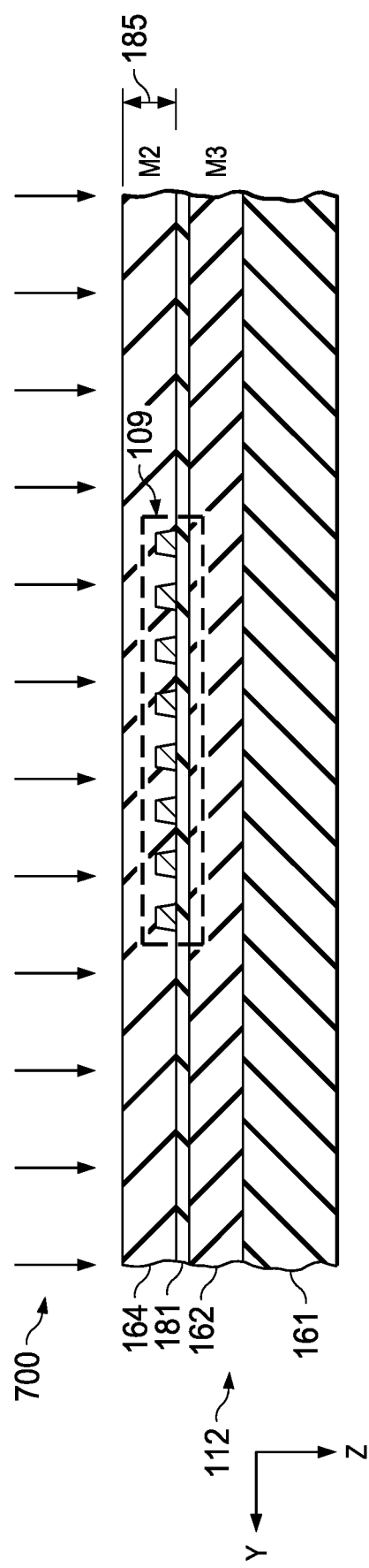

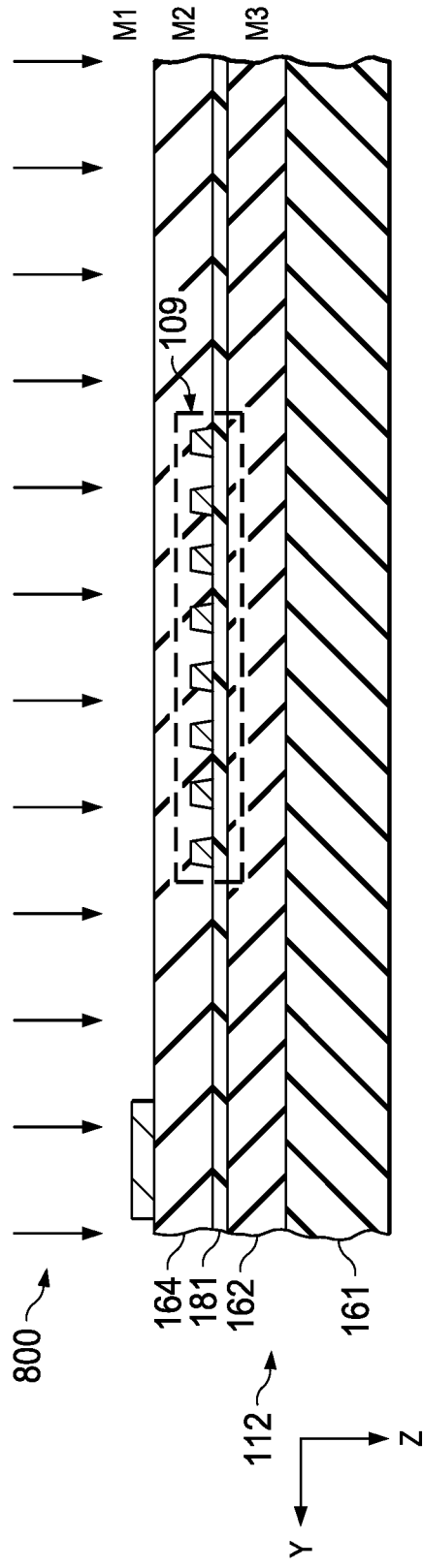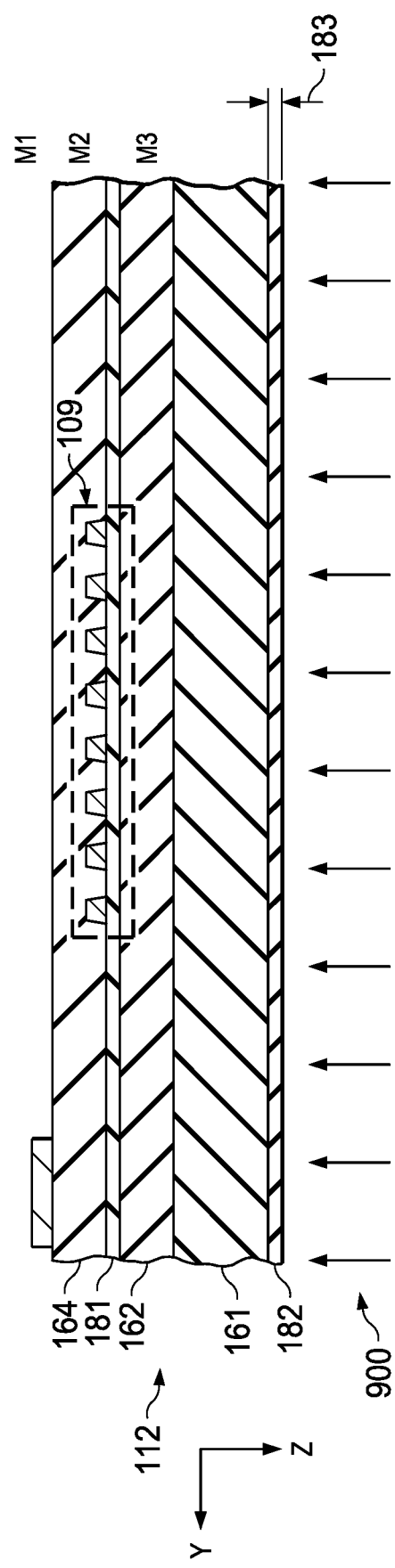

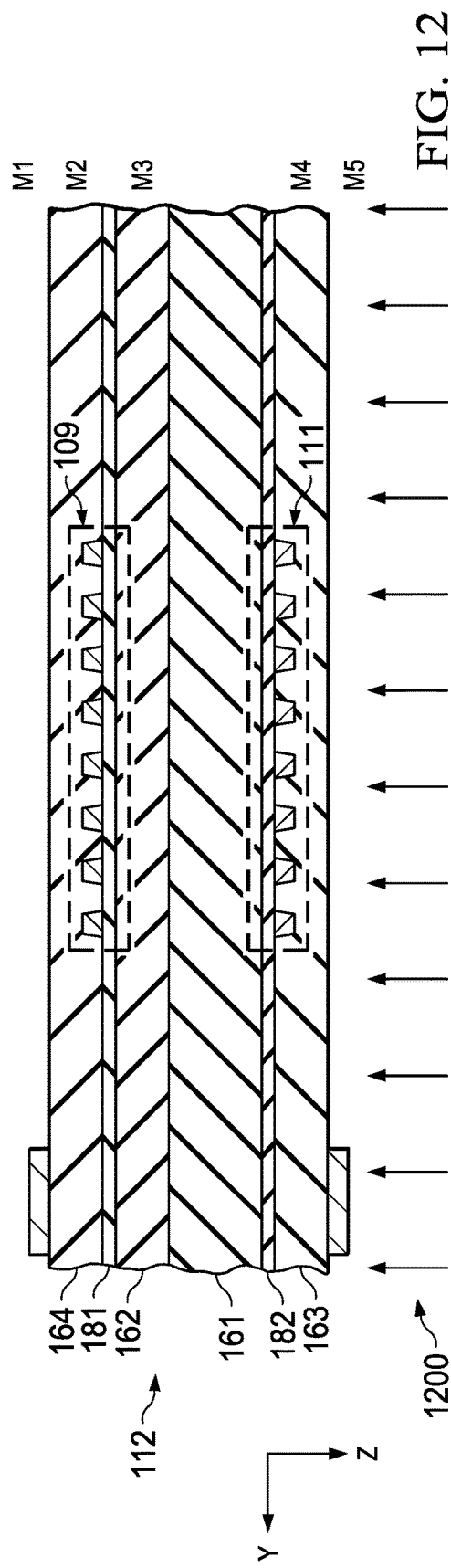
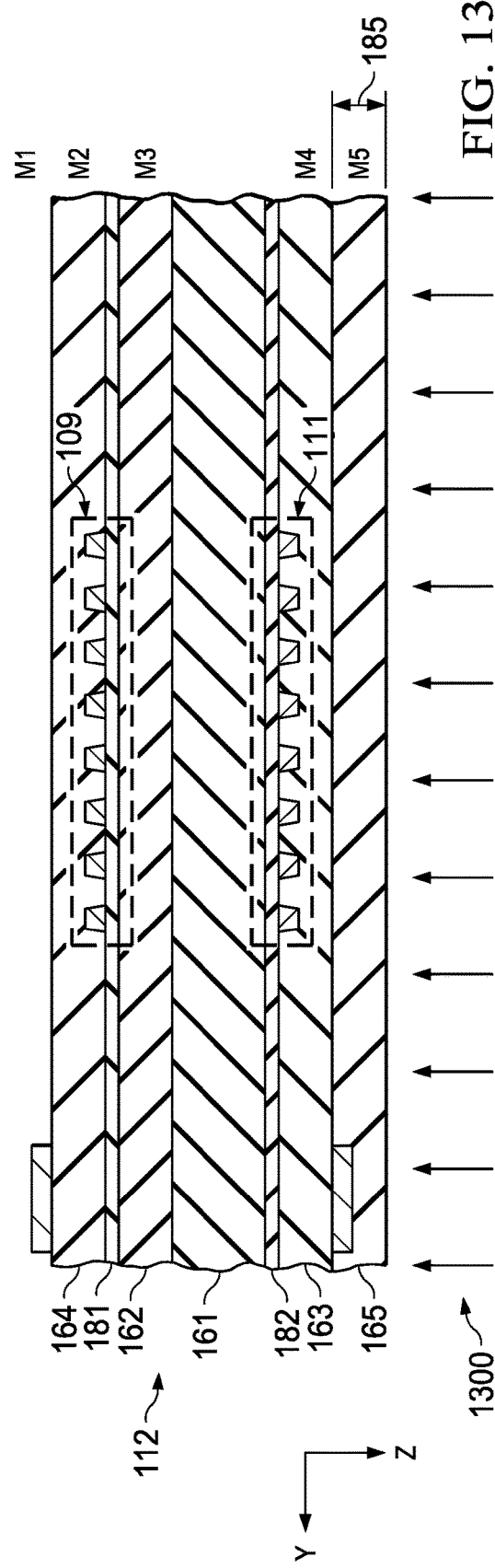

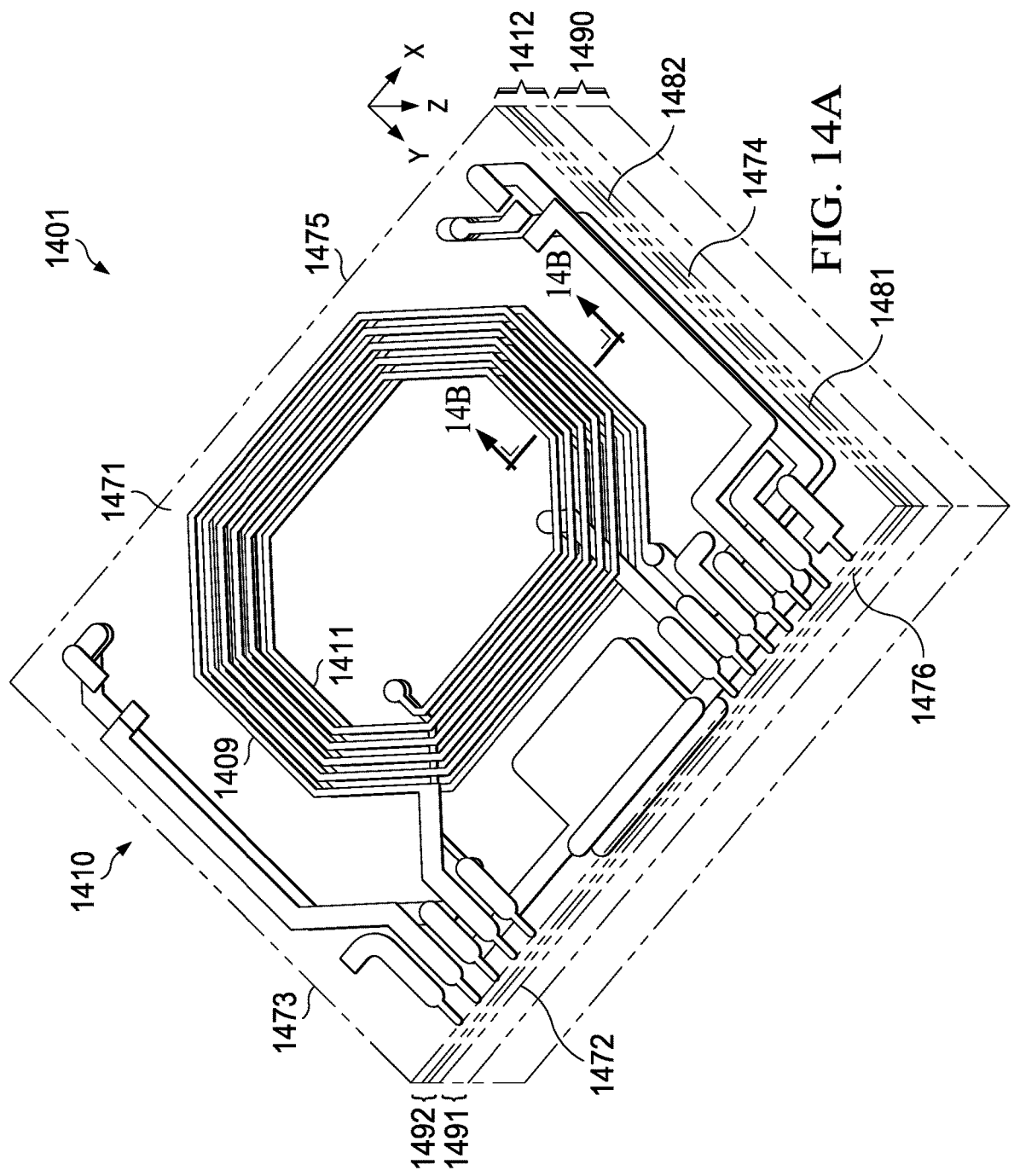

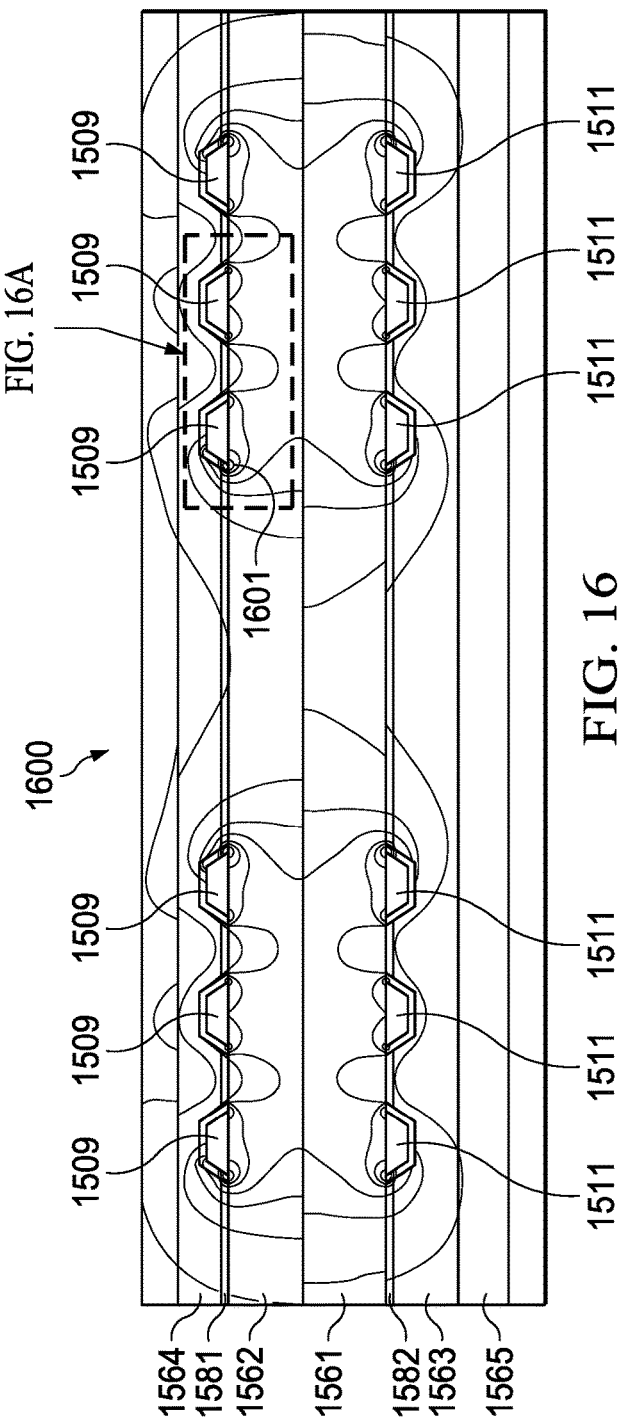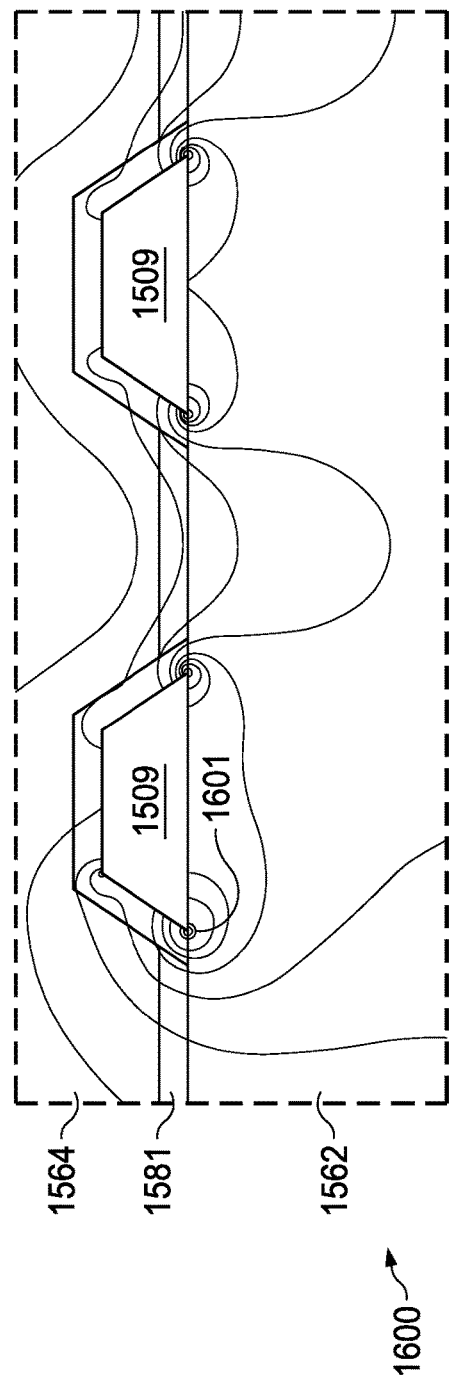
FIG. 16
FIG. 16A

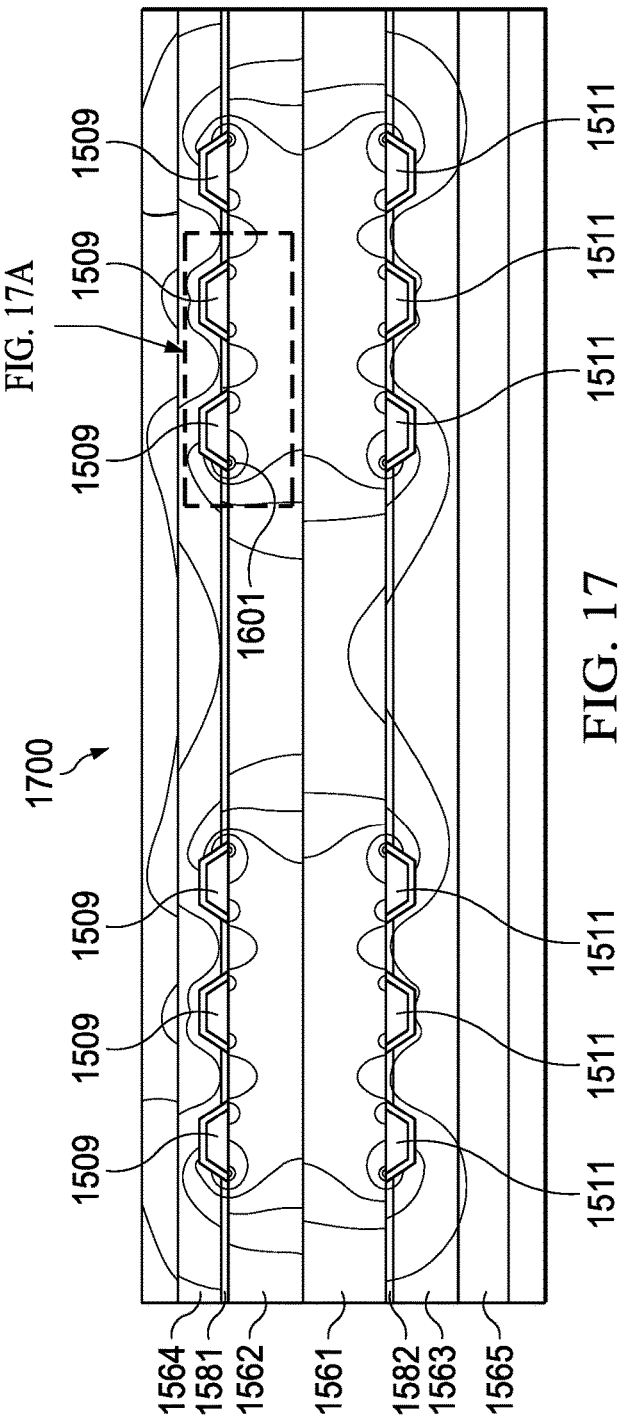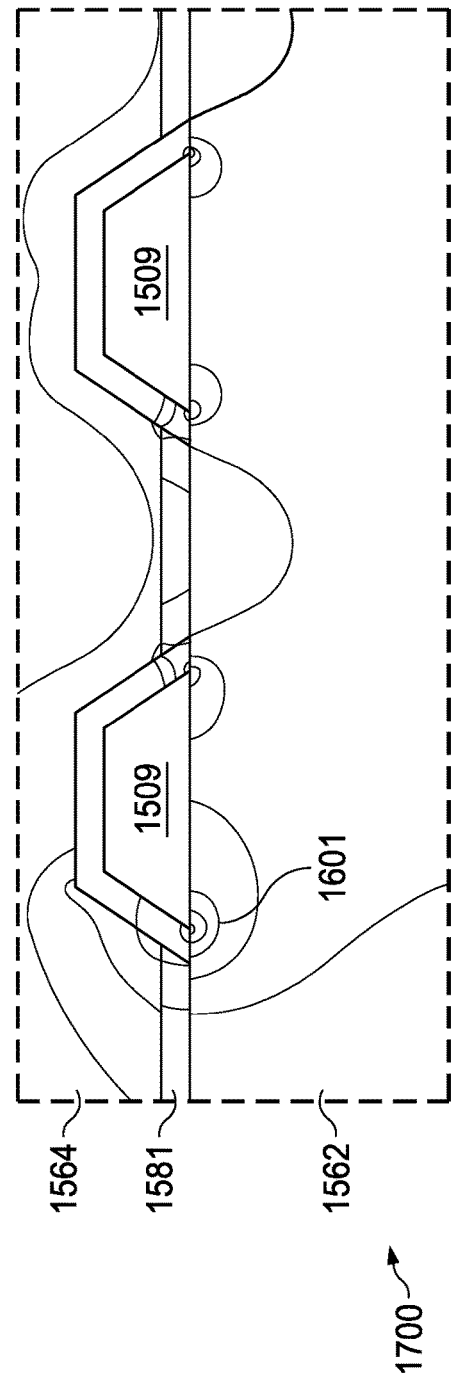

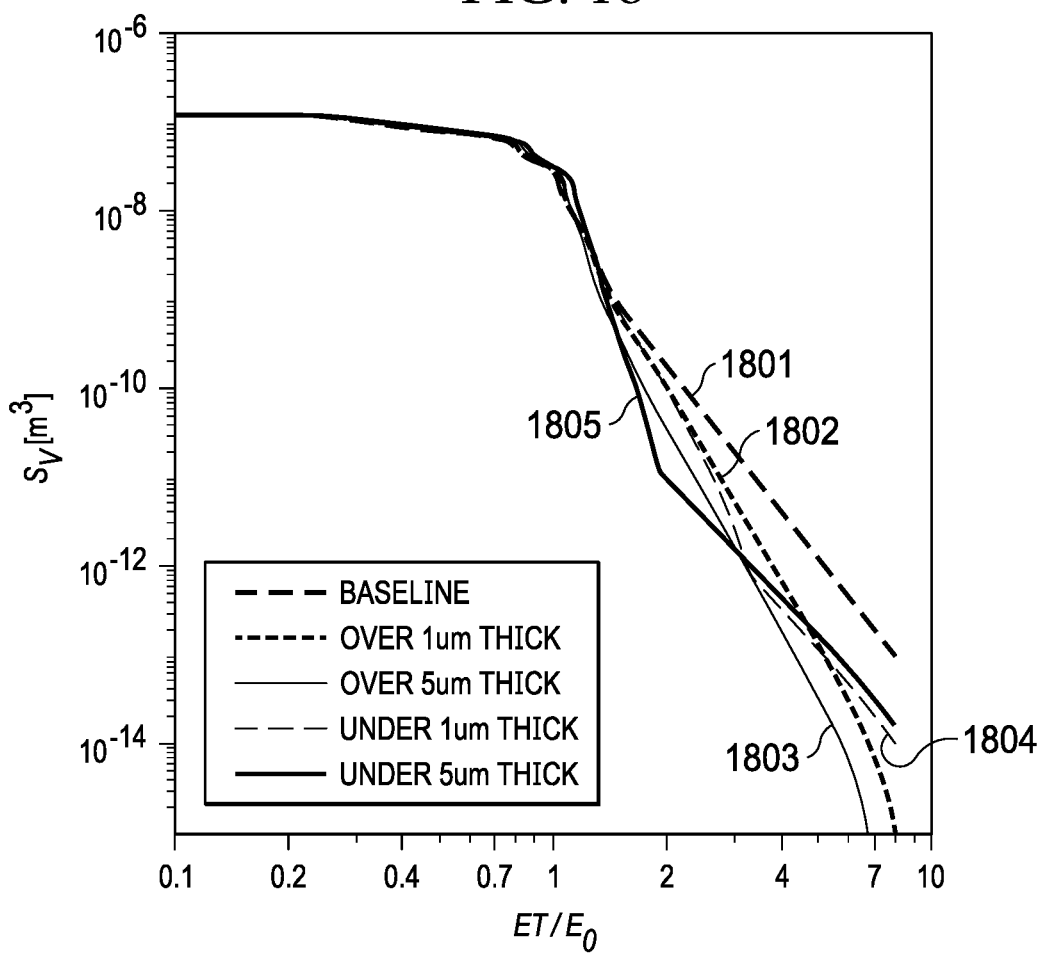

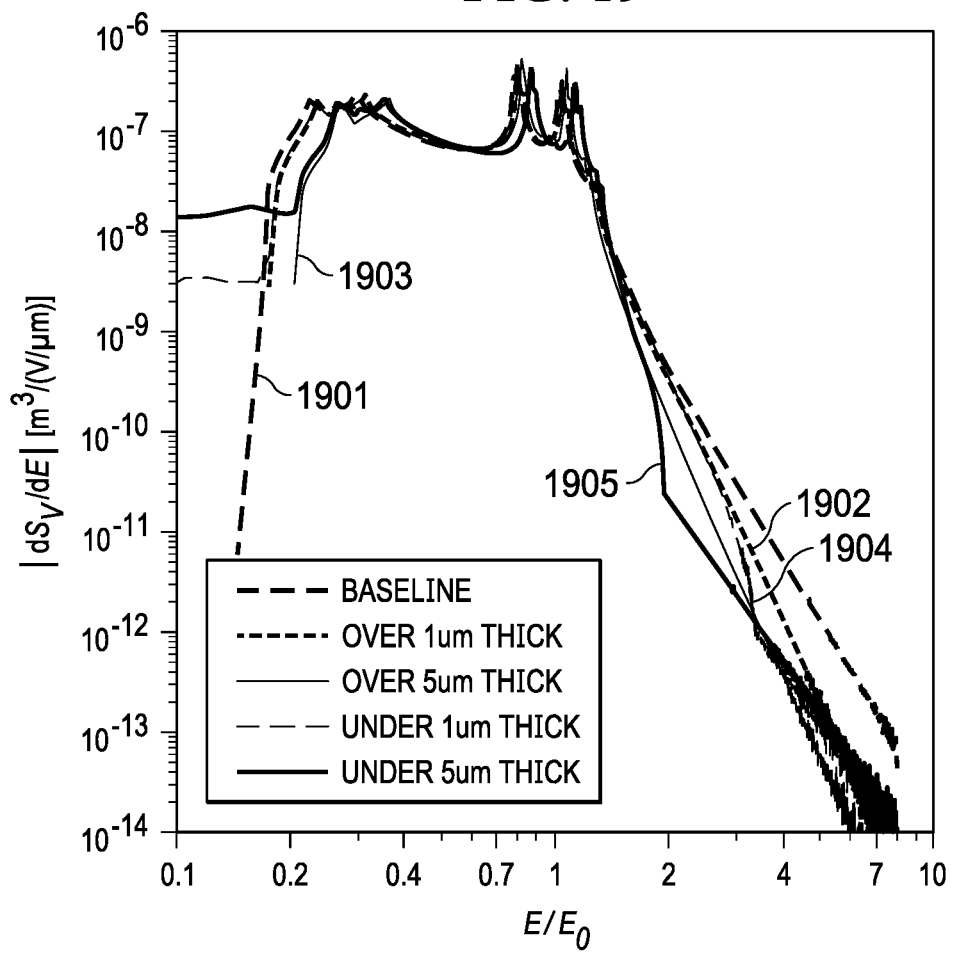

INTEGRATED HIGH VOLTAGE ELECTRONIC DEVICE WITH HIGH RELATIVE PERMITTIVITY LAYERS

BACKGROUND

Transformer windings, inductors, and capacitors of integrated magnetic assemblies and circuits can suffer from dielectric breakdown, particularly in high voltage isolation products such as laminate isolation, silicon capacitor and inductor isolation technologies. Breakdown can be caused by high electric fields at the corners of metal structures withholding a voltage potential. Dielectric breakdown can be mitigated by increases spacing between voltage nodes, but this approach leads to larger device designs. Another approach is to change the curvature of conductors, but this is limited by manufacturing process capabilities.

SUMMARY

In one aspect, an electronic device includes a package structure and a magnetic assembly in the package structure. The magnetic assembly includes a multilevel lamination or metallization structure with a core dielectric layer, dielectric stack layers, a high permittivity dielectric layer, and patterned conductive features. The dielectric stack layers has a first relative permittivity. The conductive features are formed in metal layers on or between respective ones or pairs of the dielectric stack layers. The high permittivity dielectric layer extends between and contacts the first patterned conductive feature and one of the dielectric stack layers or the core dielectric layer. The high permittivity dielectric layer has a second relative permittivity that is at least 1.5 times the first relative permittivity.

In another aspect, a magnetic assembly includes a multilevel lamination or metallization structure with a core dielectric layer, dielectric stack layers, a high permittivity dielectric layer, and patterned conductive features. The dielectric stack layers has a first relative permittivity. The conductive features are formed in metal layers on or between respective ones or pairs of the dielectric stack layers. The high permittivity dielectric layer extends between and contacts the first patterned conductive feature and one of the dielectric stack layers or the core dielectric layer. The high permittivity dielectric layer has a second relative permittivity that is at least 1.5 times the first relative permittivity.

In a further aspect, a method of fabricating an electronic device includes fabricating a magnetic assembly that includes a core dielectric layer, dielectric stack layers having a first relative permittivity, a high permittivity dielectric layer having a second relative permittivity, and first and second patterned conductive features formed in metal layers on or between respective ones or pairs of the dielectric stack layers, in which the high permittivity dielectric layer extends between and contacting the first patterned conductive feature and one of the dielectric stack layers or the core dielectric layer, and the second relative permittivity is at least 1.5 times the first relative permittivity. The method further includes attaching the magnetic assembly to a support structure, attaching a first semiconductor die to a first die attach pad, attaching a second semiconductor die to a second die attach pad, performing an electrical connection process that couples the first semiconductor die and the first patterned conductive feature in a first circuit, and couples the second semiconductor die and the second patterned conductive feature in a second circuit, and performing a molding process that encloses the magnetic assembly, the first and second die attach pads and the first and second semiconductor dies in a package structure.

BRIEF DESCRIPTION OF THE DRAWINGS

FIGS. 3-13 are partial sectional end elevation views of the packaged electronic device of FIG. 1 undergoing fabrication according to the method of FIG. 2.

FIG. 14A is a bottom perspective view of the magnetic assembly of FIG. 14.

FIGS. 16 and 16A are partial sectional side elevation views that show simulated electric fields in a baseline example of the multilayer laminate stack of FIG. 15.

FIGS. 17 and 17A are partial sectional side elevation views that show simulated electric fields in another example of the multilayer laminate stack of FIG. 15.

FIG. 18 is a graph of stressed volume as a function of applied electric field strength for the baseline and four other example high permittivity layer thicknesses.

FIG. 19 is a graph of stressed volume change as a function of applied electric field strength for the baseline and four example high permittivity layer thicknesses.

DETAILED DESCRIPTION

Figure 1:
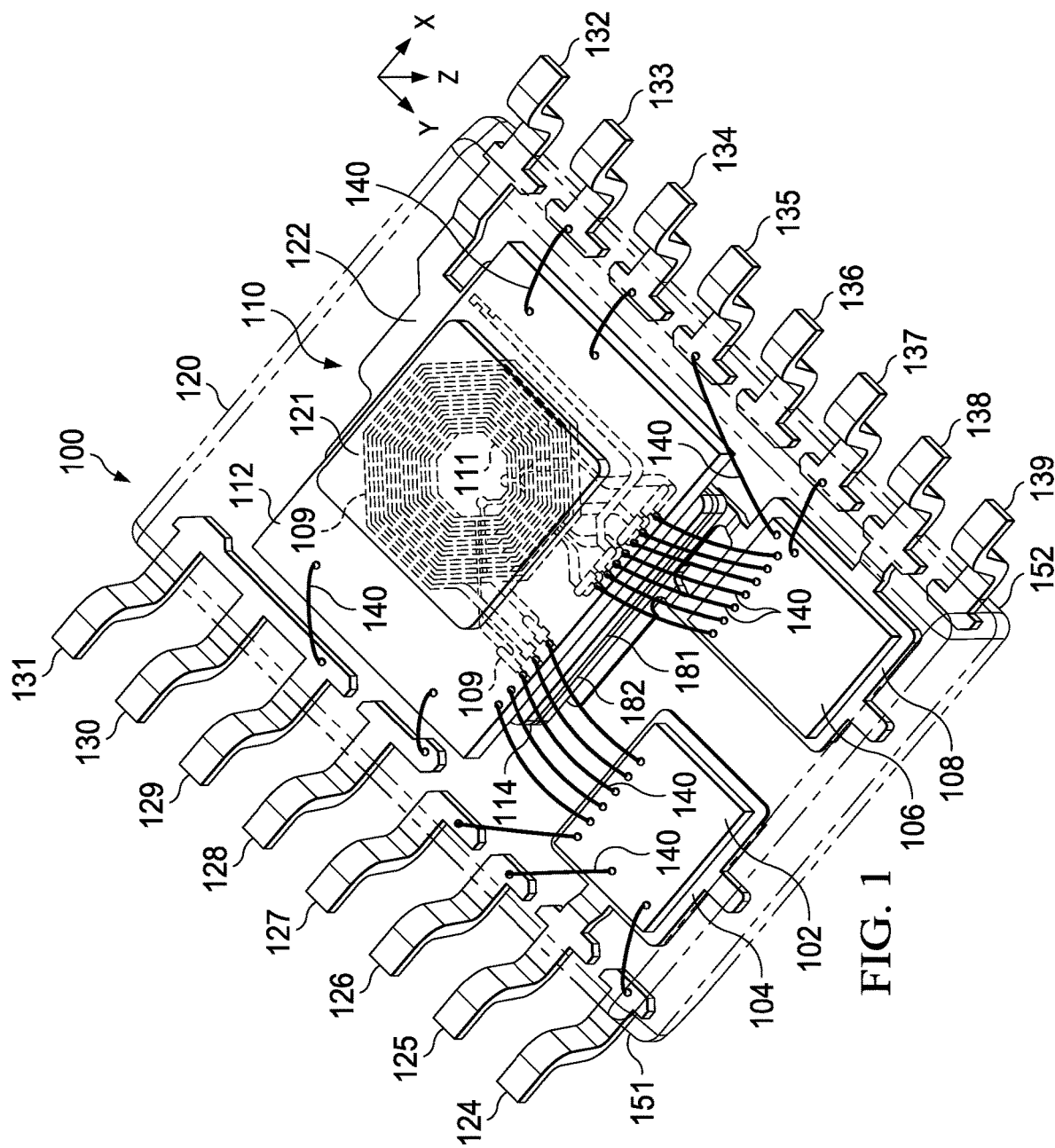
FIG. 1 is a bottom perspective view of a packaged electronic device that includes a magnetic assembly with a multilayer laminate stack having coil windings and high permittivity layers.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

Figure 1A:
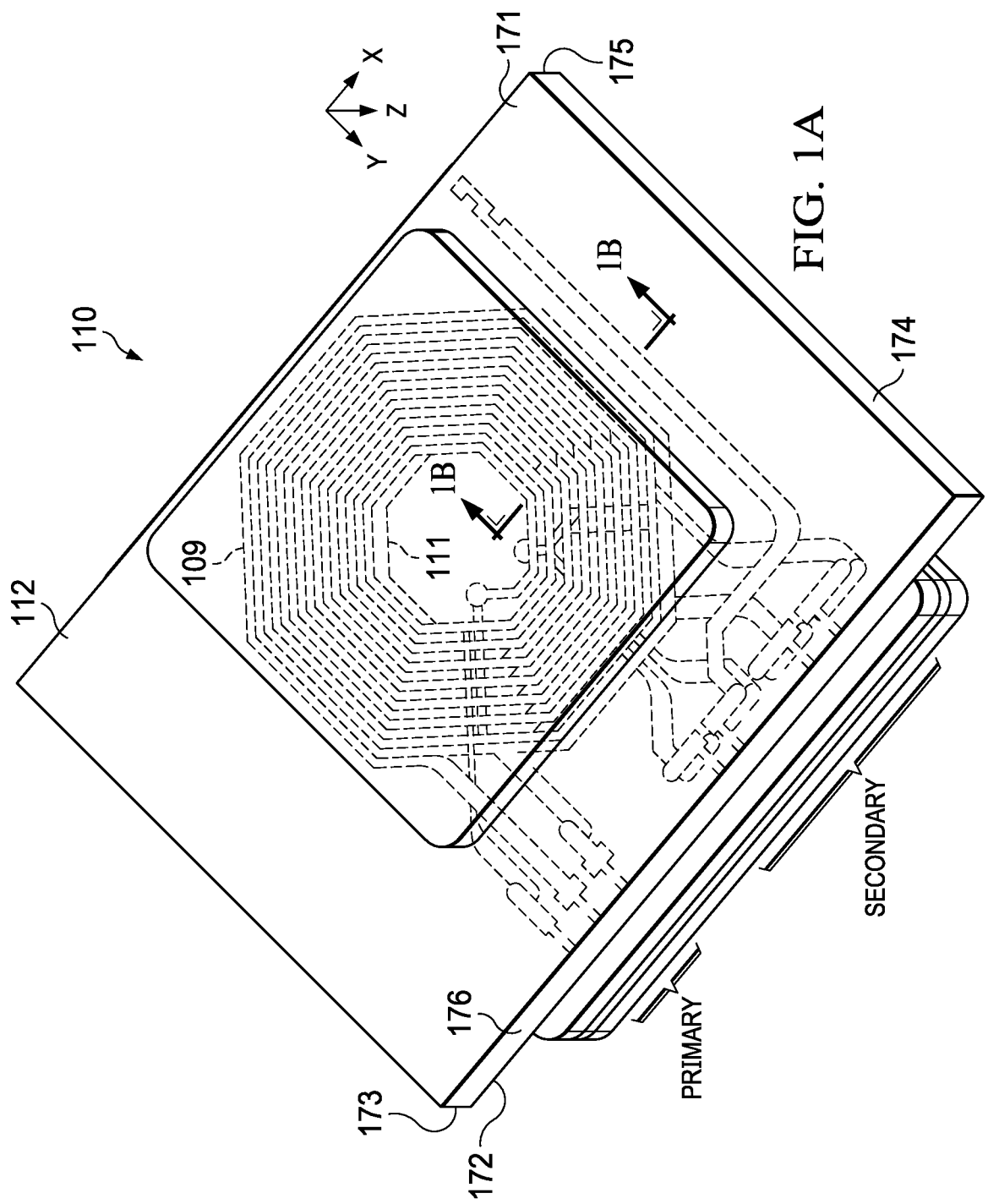
FIG. 1A is a bottom perspective view of the magnetic assembly of FIG. 1.
Figure 1B:
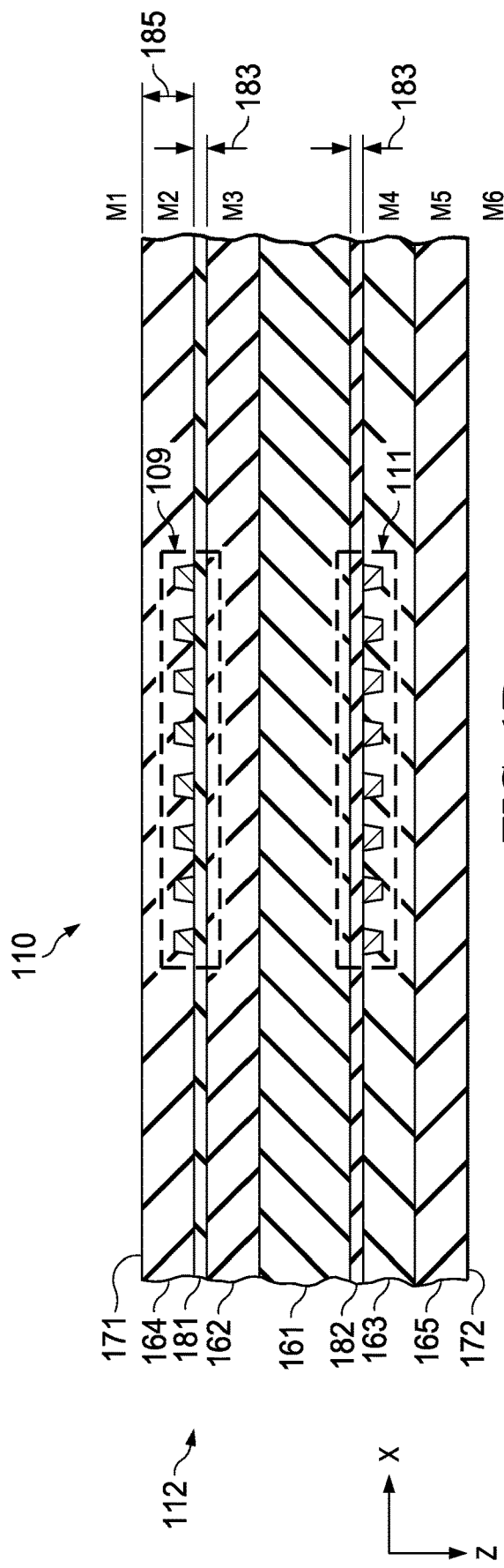
FIG. 1B is a partial sectional end view of the magnetic assembly taken along line 1B-1B of FIG. 1A.

Referring to FIGS. 1-1B, FIG. 1 shows a bottom perspective view of a packaged electronic device 100 with a laminated magnetic assembly having high permittivity dielectric layers to mitigate dielectric breakdown, particularly in high voltage isolation products such as laminate isolation, silicon capacitor and inductor isolation technologies. FIG. 1A shows a bottom perspective view of the magnetic assembly of FIG. 1 and FIG. 1B shows a partial sectional end view of the magnetic assembly taken along line 1B-1B of FIG. 1A. As used herein, the relative permittivity of a material, such as a film or layer, also referred to as the dielectric constant, is the electric permeability of the material expressed as a ratio with the electric permeability of a vacuum. In described examples, the high permittivity dielectric layers have relative permittivity 1.5 times that of dielectric stack layers of a multilevel lamination structure or of dielectric stack layers metallization structure of a semiconductor die-based implementation to help mitigate high electric fields and undesired stress within an isolation barrier without increasing the size of the integrated electronic device.

The described high permittivity dielectric layer solutions can be implemented in a magnetic assembly mounted with a semiconductor die on a shared die attach pad or the magnetic assembly can be separately mounted on a conductive support structure spaced apart from integrated semiconductor dies and associated conductive die attach pads as in the example of FIG. 1. One or more high permittivity dielectric layers can be provided in one or more layers or levels of the multilevel lamination structure and operate to reduce the overall internal field strength within desired design specifications to mitigate undesired stress within the laminate isolation barrier and premature device failure for integrated isolated power products and other electronic devices. In other examples, one or more high permittivity dielectric layers can be provided in one or more layers or levels of a multilevel metallization structure of a semiconductor die to mitigate dielectric breakdown between conductive metal structures (e.g., capacitor plates, inductor or transformer windings, etc.).

The electronic device 100 has a small outline integrated circuit (SOIC) package type with gull wing leads on opposite first and second sides spaced from one another along a first direction labelled "X" in the drawings. Other packaged electronic devices can be provided in different implementations, including conductive features that can be soldered to another structure or structures for electrical interconnections, such as so called leadless package types (e.g., flat no-leads packages such as quad-flat no-leads (QFN), dual-flat no-leads (DFN), micro lead frame (MLF) and small-outline no leads (SON) types with planar conductive leads such as perimeter lands on the package bottom and/or side that provide electrical connections to a printed circuit board (PCB). In other examples, the device 100 includes a ball grid array (BGA) package or a land grid array (LGA) type, such as a mold array process ball grid array (MAPBGA) or an over-molded BGA (e.g., plastic BGA or PBGA).

The electronic device 100 provides electrical interconnections for first and second electrical circuits, some or all of which are implemented using bond wires. In other implementations, different forms of interconnection types can be used, including substrate-based interconnections (BGA, LGA, etc.), and which a substrate includes electrical interconnections and signal routing structures (e.g., copper or aluminum traces on one or more layers or levels) alone or in combination with bond wire electrical connections.

As shown in FIG. 1, the example device 100 includes conductive features (e.g., conductive die attach pads or supports) for mounting and supporting first and second semiconductor dies and a laminated magnetic assembly. The die attach pads and device leads can include any suitable conductive structures and materials, such as copper, aluminum, etc. The example device 100 in FIG. 1 includes a first semiconductor die 102 attached to a first conductive die attach pad 104 of a starting lead frame assembly. The device 100 also includes a second semiconductor die 106 attached to a second conductive die attach pad 108.

The electronic device 100 includes a first circuit associated with a first voltage domain (e.g., a high voltage primary circuit of an integrated power device) as well as a second circuit associated with a second voltage domain (e.g., an isolated lower voltage secondary circuit). A first patterned conductive feature 109 has multiple turns in a magnetic assembly 110 to form a first winding (e.g., a primary winding of an isolation transformer of the first circuit). The second circuit in this example includes a secondary winding formed by a second patterned conductive feature 111 (also referred to as a second winding) of the magnetic assembly 110. The magnetic assembly 110 in FIGS. 1-1B includes a multilevel lamination structure 112 having the first and second patterned conductive features 109 and 111. In one example, the multilevel lamination structure 112 is or includes a multilevel package structure. The first and second patterned conductive features 109 and 111 each have multiple turns to form respective first and second windings that extend in respective planes of orthogonal first and second directions X and Y in the position illustrated in the figures. The magnetic assembly 110 also includes one or more magnetic core structures to facilitate forming a magnetic circuit in combination with the patterned conductive features 109 and 111. The illustrated example includes a first (lower or bottom) magnetic core structure 114. The first magnetic core structure 114 is attached to a first (e.g., bottom) side of the multilevel lamination structure 112.

The packaged electronic device 100 also includes a package structure 120 that encloses the conductive die attach pads 104 and 108, the semiconductor dies 102 and 106, the magnetic assembly 110, and portions of conductive leads of the device 100. In one example, the package structure 120 is or includes a molded material, such as plastic. In another example, the package structure 120 is or includes a ceramic material. The magnetic assembly 110 also includes a second (upper or top) magnetic core structure 121 attached to a second (e.g., top) side of the multilevel lamination structure 112. In one example, the first magnetic core structure 114 is the same size as the second magnetic core structure 121. In another example, the first magnetic core structure 114 is larger than the second magnetic core structure 121. In another example, the first magnetic core structure 114 is smaller than the second magnetic core structure 121. In one example, one or both magnetic core structures 114 and 121 are prefabricated magnetic cores attached using epoxy paste. In another example, one or both magnetic core structures 114 and 121 are fabricated using a thick layer of magnetic paste. The magnetic assembly 110 is attached to a support structure 122 that is integral to the second conductive die attach pad 108. In another implementation, the magnetic assembly 110 is mounted to a support structure (not shown) that is separated and spaced apart from the first and second die attach pads 104 and 108. The packaged electronic device 100 has conductive gull-wing shaped leads 124-131 along one side of the device 100, as well as conductive gull-wing shaped leads 132-139 along an opposite side.

The packaged electronic device also includes bond wires 140. A first set of the bond wires 140 interconnect certain of the leads 124-131, the primary winding of the magnetic assembly 110 and the first semiconductor die 102 in a first circuit. A second set of the bond wires 140 interconnect certain of the leads 132-139, the secondary winding of the magnetic assembly 110 and the second semiconductor die 106 in a second circuit. As best shown in FIG. 1, the first conductive die attach pad 104 is directly coupled to a single first lead 125. In other examples, the die attach pad 104 is directly coupled to multiple conductive first leads. In the example device 100, the die attach pad 104 and the lead 125 are a single continuous metal structure, such as copper or aluminum. The second conductive die attach pad 108 is directly coupled to a single lead 138, and the connected support structure 122 is directly connected to a single lead 132. In other examples, the second die attach pad 108 and/or the support structure 122 is/are directly coupled to multiple conductive leads. In the example device 100, the second die attach pad 108, the support structure 122, and the leads 132 and 138 are a single continuous metal structure, such as copper or aluminum. The package structure 120 encloses the die attach pads 104 and 108, and the associated support structure 122. Also, the package structure 120 encloses inner portions of the conductive leads 124-139. The conductive leads 124-139 in one example are so-called gull wing leads that extend downward and outward from the package structure 120. Different types and shapes of conductive leads can be used in other examples (e.g., J leads).

As best shown in FIG. 1, the package structure 120 has respective first and second sides 151 and 152 spaced apart from one another along the first direction (e.g., the X direction). The first conductive leads 124-131 are located along, and extend outward from, the first side 151 of the package structure 120, and the second conductive leads 132-139 are located along, and extend outward from, the second side 152 of the package structure 120.

As shown in the sectional view of FIG. 1B, the multilevel lamination structure 112 includes a core dielectric layer 161 and dielectric stack layers 162, 163, 164 and 165, such as laminate layers. The core dielectric layer 161 and the dielectric stack layers 162-165 are or include electrically insulating dielectric material, where the thickness and material of the core dielectric layer 161 provides a withstanding voltage according to a desired voltage separation between the first and second circuits for a given design. The individual dielectric stack layers 162-165 have a first relative permittivity.

The conductive features 109 and 111 are formed in one or more of six metal layers M1, M2, M3, M4, M5 and M6 on or between respective ones or pairs of the dielectric stack layers 162-165 and/or the core dielectric layer 161. The core dielectric layer 161 and the dielectric stack layers 162-165 extend in respective planes of the first and second directions X, Y and are stacked along the third direction Z as best shown in the sectional view of FIG. 1B. The core dielectric layer 161 in one example provides an electrical isolation barrier between the first or primary circuit and an associated first voltage domain, and a second or secondary circuit operating at an associated second voltage domain. The multilevel lamination structure 112 also has one or more conductive vias providing electrical interconnection for routing signals between two or more of the six metal layers M1-M6.

As shown in FIG. 1B, the multilevel lamination structure 112 has a Z-direction stack of metal levels M1, M2, M3, M4, M5 and M6 formed on or in or between a core dielectric layer 161 and the dielectric stack layers 162-165. The first patterned conductive feature 109 includes multiple turns in the metal layer M2 to form the first winding, and the second patterned conductive feature 111 has multiple turns in the metal layer M4. The first and second windings are on opposite sides of the core dielectric layer 161. In one example, the first patterned conductive feature 109 is formed in the metal layer M2, and the second patterned conductive feature 111 is formed in the metal layer M4. In this example, the first patterned conductive feature 109 is formed in the second metal layer M2 above the core level 161 and the core dielectric layer 161 is positioned between the first and second patterned conductive features 109 and 111 along the third direction Z. In other examples, more or fewer dielectric stack layers 161-165 can be provided, and more or fewer metal layers can be used. In this or another example, the multilevel lamination structure 112 includes capacitor plates (not shown), for example, on opposite sides of the core dielectric layer 161 and the resulting capacitor has respective terminals coupled to the first and second circuits on either side of the electrical isolation barrier provided by the core dielectric layer 161. In another implementation, the multilevel lamination structure 112 has capacitor plates and no windings.

As further shown in FIG. 1A, the multilevel lamination structure 112 has a first or bottom side 171 and a second or top side 172 spaced apart from one another along the third direction Z, as well as lateral sides 173 and 174 spaced apart from one another along the first direction X, and lateral sides 175 and 176 spaced apart from one another along the second direction Y.

The multilevel lamination structure 112 has first and second high permittivity dielectric layers 181 and 182. The first high permittivity dielectric layer 181 extends between, and contacts, the first patterned conductive feature 109 and one of the dielectric stack layers 162. The second high permittivity dielectric layer 182 extends between, and contacts, the second patterned conductive feature 111 and the core dielectric layer 161. The first and second high permittivity dielectric layers 181 and 182 have a second relative permittivity that is at least 1.5 times the first relative permittivity. The first and second high permittivity dielectric layers 181 and 182 help to smooth the electric field around the conductors of the conductive features 109 and 111 in operation when the electronic device 100 is powered and operating. In one example, the second relative permittivity is 6 or more and 500 or less, such as 10 or more and 20 or less. As shown in FIG. 1B, the individual high permittivity dielectric layers 181 and 182 have a minimum thickness 183 along the third direction Z, for example, 5 um of more and 20 um or less. The individual dielectric stack layers 161-165 have thicknesses 185 that are more than 3 times the thickness 183 of the first and second high permittivity dielectric layers 181 and 182.

In one implementation, the high permittivity dielectric layers 181 and 182 are or include a polymeric material used in laminates, such as Bismaleimide-Triazine (e.g., BT resin) having filler particles. In one example, the filler particles are or include aluminum oxide (e.g., $Al_2O_3$) of any suitable stoichiometry. In this or another example, the filler particles are or include zirconium dioxide (e.g., $ZrO_2$) of any suitable stoichiometry. In these or another example, the filler particles are or include barium titanate (e.g., BTO) of any suitable stoichiometry. In these or another example, the filler particles are or include barium zirconate (e.g., BZO) of any suitable stoichiometry. In these or another example, the filler particles are or include hafnium oxide (e.g., $HFO_2$) of any suitable stoichiometry.

Referring now to FIGS. 2-13, FIG. 2 shows a method 200 of fabricating an electronic device, and FIGS. 3-13 show partial sectional end elevation views of the packaged electronic device 100 undergoing fabrication according to the method 200. The method 200 includes fabricating the magnetic assembly 110 at 201, 202, 204 and 206, including fabricating the multilevel lamination structure 112 at 201. In certain implementations, the multilevel lamination structure 112 of the magnetic assembly 110, or the magnetic assembly 110 itself is fabricated and provided as an input to a separate fabrication method used to produce a packaged electronic device 100.

The illustrated lamination structure fabrication at 201 constructs the example multilevel lamination structure 112 that includes the core dielectric layer 161, the dielectric stack layers 162, 163, 164, 165 having the first relative permittivity, one or more high permittivity dielectric layers (e.g., layers 181 and 182) having the second relative permittivity, and the first and second patterned conductive features 109 and 111 formed in the metal layers M1, M2, M3, M4, M5, M6 on or between respective ones or pairs of the dielectric stack layers 162, 163, 164, 165. In one example, the lamination structure fabrication forms the first high permittivity dielectric layer 181 extending between, and contacting, the first patterned conductive feature 109 and the dielectric stack layer 162 and forms the second high permittivity dielectric layer 182 extending between, and contacting, the second patterned conductive feature 111 and the core dielectric layer 161.

FIGS. 3-13 show one implementation of the multilevel lamination structure fabrication at 201, including formation of successive layers or levels in each of the top and bottom sides of the starting dielectric core dielectric layer 161, each including a dielectric material layer 162-165 and patterned conductive metal features (e.g., copper, aluminum or alloys thereof) labeled as the six metal layers M1-M6. The processing in one example at 201 also includes forming conductive features and conductive inter-level vias (not shown) to interconnect patterned conductive features of different layers to one another. In one example, the processing at 201 also includes forming conductive capacitor plates (not shown) in one or more of the metal layers M1-M6.

The conductive features 109 and 111 in the illustrated example are formed in or on one or more of the six metal layers M1, M2, M3, M4, M5 and M6 on or between respective ones or pairs of the dielectric stack layers 162-165 and/or the core dielectric layer 161. In the illustrated orientation, the core dielectric layer 161 and the dielectric stack layers 162-165 extend in respective X-Y planes and are stacked along the third direction Z. The lamination structure 112 in one example is fabricated as or including build-up material formed by dry film lamination that begins as sheets that are pressed or otherwise installed onto a previous layer that may include patterned conductive features on a side thereof. The attached build-up material sheet fills gaps between the existing patterned conductive features and provides a dielectric stack layer with a generally planar side for formation of patterned conductive features of a new metal layer, and conductive vias are formed through the attached layer and to a subsequent layer. In one example, the lamination structure 112 and the constituent buildup material sheets are or include an organic material.

Figure 3:
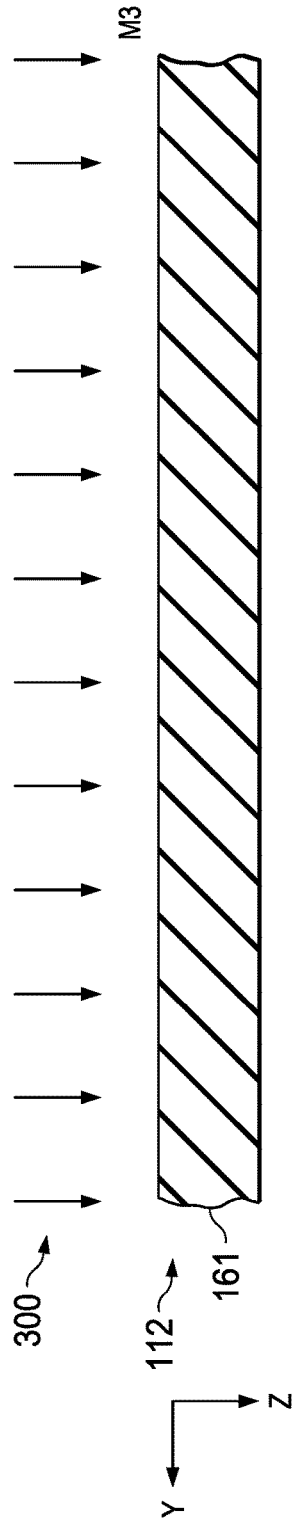
Figure 4:
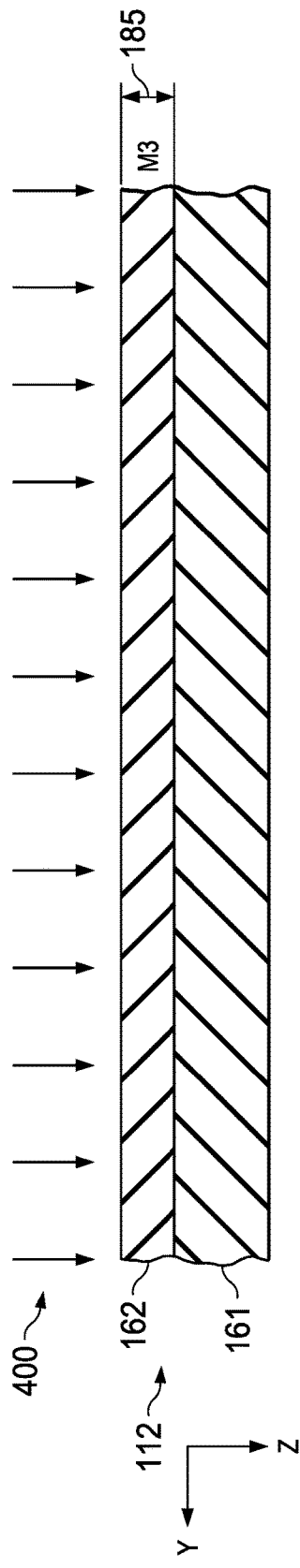

In FIG. 3, a process 300 is performed that positions the core dielectric layer 161 as a sheet or strip on a carrier, such as an adhesive tape (not shown) for concurrent processing of multiple areas that individually correspond to a prospective multilevel lamination structure 112, and which are subsequently separated, for example, by saw cutting, laser cutting or other suitable process. The processing 300 in one example includes forming one or more patterned conductive features (not shown) of the metal layer M3 on the bottom side of the core dielectric layer 161 and/or formation of one or more conductive vias (not shown) through the core dielectric layer 161. In FIG. 4, a first attachment process 400 is performed that attaches the dielectric stack layer 162 to the bottom side of the core dielectric layer 161, for example, by dry film lamination, having the thicknesses 185.

Figure 5:
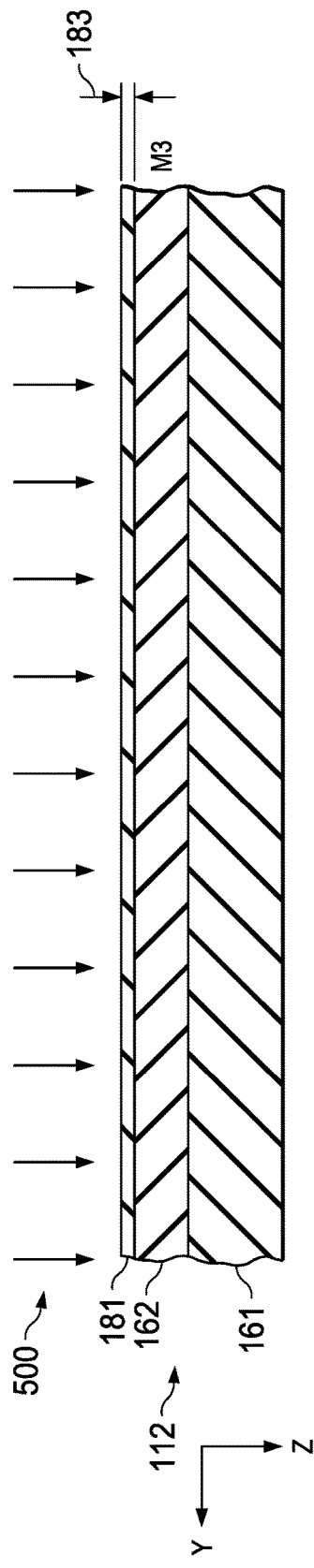

In FIG. 5, a process 500 is performed that deposits or otherwise forms the first high permittivity dielectric layer 181 directly on, and contacting, the dielectric stack layer 162. In one example, the process 500 includes forming the first high permittivity dielectric layer 181 by dispensing, printing, spraying, silk screening or other suitable process, with or without subsequent squeegee planarizing, to form the layer 181 as or including BT resin having filler particles, where the filler particles are or include one or more of aluminum oxide, zirconium dioxide, barium titanate, barium zirconate (e.g., BZO), and hafnium oxide (e.g., $HFO_2$) of any suitable stoichiometry, as described above. In one example, the process 500 forms the first high permittivity dielectric layer 181 to the thickness 183 (e.g., 5 um of more and 20 um or less) along the third direction Z.

In FIG. 6, a metallization process 600 is performed that forms the patterned conductive coil winding features 109 of the metal layer M2 on, and contacting, the bottom side of the first high permittivity dielectric layer 181, for example, by blanket deposition and patterned etching. The metallization process 600 and other metallization processes of the lamination structure fabrication include formation of any desired conductive via structures to extend through the previously attached dielectric stack layer. In FIG. 7, an attachment process 700 is performed that attaches the dielectric stack layer 164 to the bottom side of the dielectric stack layer 162, covering and filling gaps between the patterned conductive features 109 of the metal layer M2. In FIG. 8, another metallization process 800 is performed that forms patterned conductive features of the bottom metal layer M1.

In FIG. 9, a process 900 is performed that deposits or otherwise forms the second high permittivity dielectric layer 182 directly on, and contacting, the core layer 116. In one example, the process 900 includes forming the second high permittivity dielectric layer 182 by dispensing, printing, spraying, silk screening or other suitable process, with or without subsequent squeegee planarizing, to form the layer 182 as or including BT resin having filler particles, where the filler particles are or include one or more of aluminum oxide, zirconium dioxide, barium titanate, barium zirconate (e.g., BZO), and hafnium oxide (e.g., $HFO_2$) of any suitable stoichiometry, as described above. In one example, the process 900 forms the second high permittivity dielectric layer 182 to the thickness 183 (e.g., 5 um of more and 20 um or less) along the third direction Z.

Figure 10:
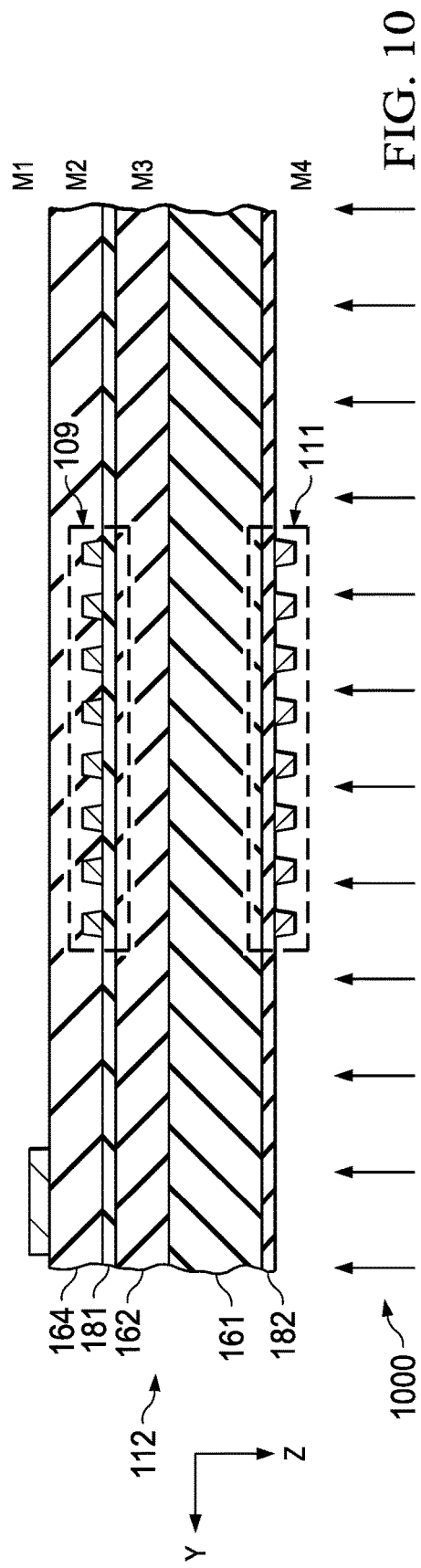
Figure 11:
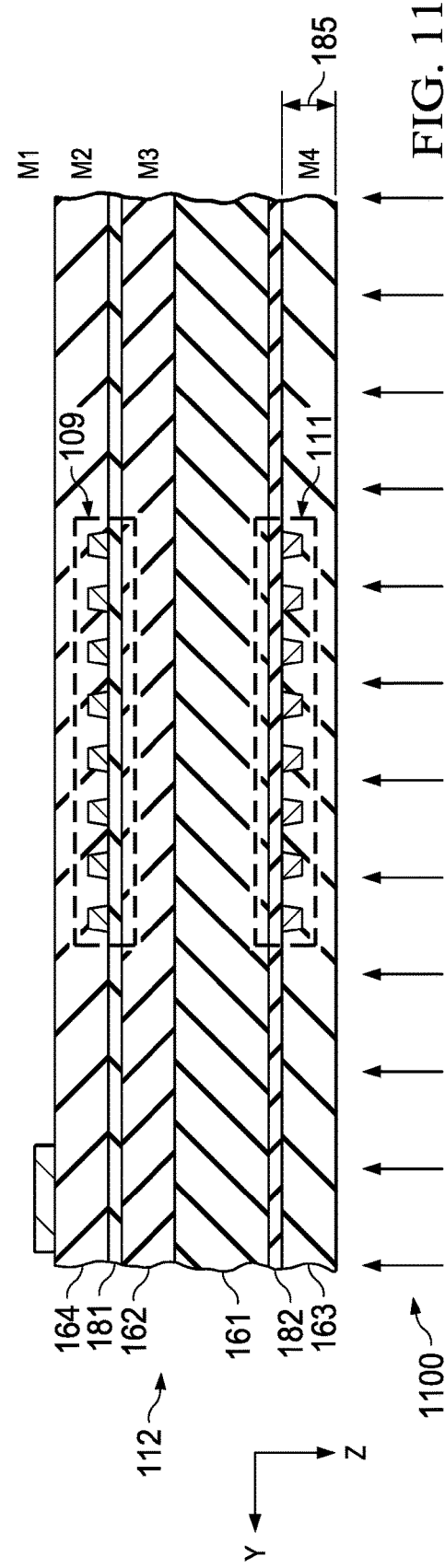

In FIG. 10, a metallization process 1000 is performed that forms the patterned conductive coil winding features 111 of the metal layer M4 on the top side of the core dielectric layer 161. In FIG. 11, an attachment process 1100 is performed that attaches the dielectric stack layer 163 to the top side of the core dielectric layer 161, covering and filling gaps between the patterned conductive features 111 and 142. In FIG. 12, a metallization process 1200 is performed that forms the patterned conductive features of the metal layer M5 on the top side of the dielectric stack layer 163. In FIG. 13, another attachment process 1300 is performed that attaches the dielectric stack layer 165 to the top side of the previous dielectric stack layer 163, covering and filling gaps between the patterned conductive features of the metal layer M5. In one example, the multilayer lamination structure fabrication at 201 includes formation of conductive metal features on the top and/or bottom side of the lamination structure 112 to allow bond wire connection to the transformer windings in the finished packaged electronic device 100 (e.g., FIG. 1). In one example, the multilayer lamination structure fabrication at 201 includes curing processing.

Figure 2:
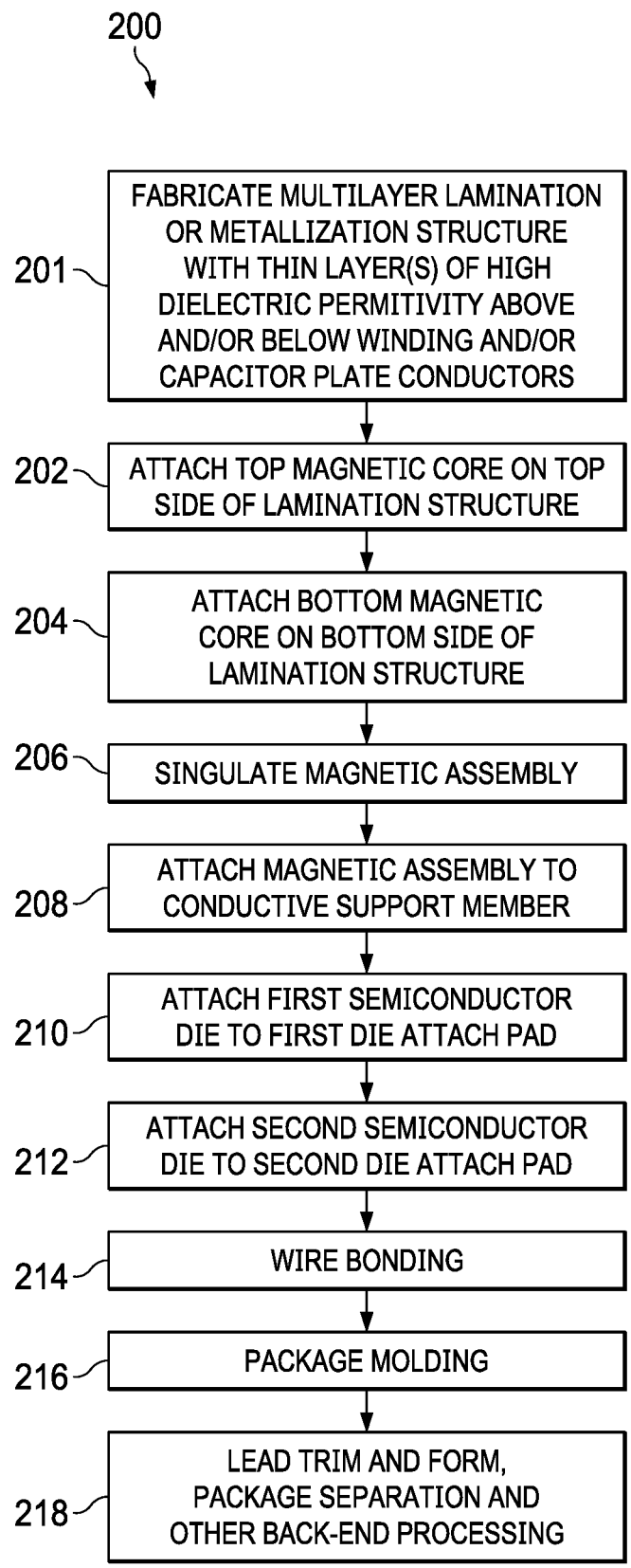
FIG. 2 is a flow diagram of a method of fabricating an electronic device.

The method 200 continues at 202 in FIG. 2 with attaching the top magnetic core structure 114 to the top side of the multilayer lamination structure 112, for example, using epoxy or another suitable adhesive (not shown). The magnetic core structure 114 in one example is a magnetic sheet structure, although not required of all possible implementations. The attachment process at 202 can include deposition of an epoxy or other adhesive onto the bottom surface of the multilevel lamination structure 112 and/or onto the surface of the core structure 114. The adhesive in one example is printed magnetic ink epoxy, although non-magnetic adhesives can be used in other examples. The attachment process at 202 also includes bringing the core structure 114 into contact with a portion of the top side of the multilevel lamination structure 112 and/or into contact with the epoxy formed thereon. The attachment process at 202 in one example also includes any necessary curing steps (e.g., thermal, optical, ultraviolet (UV), etc.).

At 204 in FIG. 2, the method 200 continues with attachment of the second magnetic core structure 121 to the opposite bottom side of the multilayer lamination structure 112. The attachment at 204 attaches the second magnetic core structure 121 to a portion of the bottom side of the dielectric stack layer 164, for example, using epoxy or other adhesive (not shown) in an attachment process and like the process at 202 to attach the first magnetic core structure 114 as described above. In other examples, one or both magnetic core structures 121 and 114 can be omitted, with the remaining core structure providing magnetic coupling for the transformer of the device 100.

The method 200 in one example further includes separating (e.g., singulating) the magnetic assembly at 206. In the illustrated implementation, the magnetic assembly process is used to concurrently fabricate multiple laminated magnetic assemblies, such as using a single large multilevel lamination structure 112, and attachment of one or more core structures 114, 121 to opposite sides thereof. At 206 in one example, the lamination structure 112 is diced or cut to singulate or separate individual laminated magnetic assemblies 110 (not shown) from the initial unitary structure, for example, using a saw blade, etching, laser cutting, etc.

At 208, the magnetic assembly 110 is attached to the support structure 122 of a starting lead frame. In one example, the starting lead frame is a panel with an array of rows and columns of prospective device areas processed concurrently, followed by subsequent device separation after package molding. In one example, a lead frame structure is provided that includes the support structure 122, conductive leads (e.g., 124-139 in FIG. 1) and conductive die attach pads 104 and 108. In one implementation, the lead frame structure is provided on a tacky tape or other adhesive carrier, with the various constituent structures assembled in a predetermined relative arrangement to facilitate subsequent assembly steps in the method 200. Any suitable attachment process can be used, such as application of adhesive, joining the components, and any necessary curing. In another example, conductive features of the multilevel lamination structure 112 can be soldered to the support structure 122 at 208.

The process 200 continues at 210 and 212 in FIG. 2 with attaching semiconductor dies to corresponding die attach pads, for example, using adhesive or soldering. The attachment process at 210 attaches the first semiconductor die 102 to the first die attach pad 104 (e.g., where the die attach pad 104 is one continuous conductive structure that includes the lead 125) in the orientation shown in FIG. 1 above. At 212, the processing also attaches the second semiconductor die 106 to the corresponding second die attach pad 108 (e.g., one continuous conductive structure that also includes the lead 138) as shown in FIG. 1.

The method 200 also includes wire bonding or other electrical connection processing at 214. FIG. 1 shows one example in which the wire bond connections 140 are formed between the semiconductor dies 102, 106 and one or more conductive leads and/or exposed conductive features of the magnetic assembly 110 to form the first and second circuits. In another example, different electrical connections are formed to create the circuits, such as flip-chip processing to interconnect solder balls, conductive pillars, bond pads, etc. of the structures together in first and second electrical circuits. In certain examples, the wire bonding or other interconnection processing at 214 can be performed using supporting structures to provide mechanical structural support for one or more features of the magnetic assembly 110 during bond wire attachment. In one example, one or both magnetic core structures 114 and 121 can be supported with a custom bond wire clamping tool (not shown) during bond wire soldering operations. In one example, the bond wire clamping tool can include a cavity to support the laminate bond pad area that extends beyond the portions supported by the magnetic core structure or structures 114 and/or 121.

The method 200 continues at 216 with forming the final package structure 120. In one example, the packaging at 216 includes performing a molding process (not shown) that forms the package structure 120 to enclose the dies 102 and 106, the conductive die attach pads 104 and 108, the support structure 122, the magnetic assembly 110, the electrical connections (e.g., the bond wires 140) and portions of the conductive leads 124-139. At 218 in FIG. 2, lead trimming and forming operations are performed along with package separation and other back and processing to provide multiple finished packaged electronic device products, such as the device 100 shown in FIG. 1 above.

Figure 14:
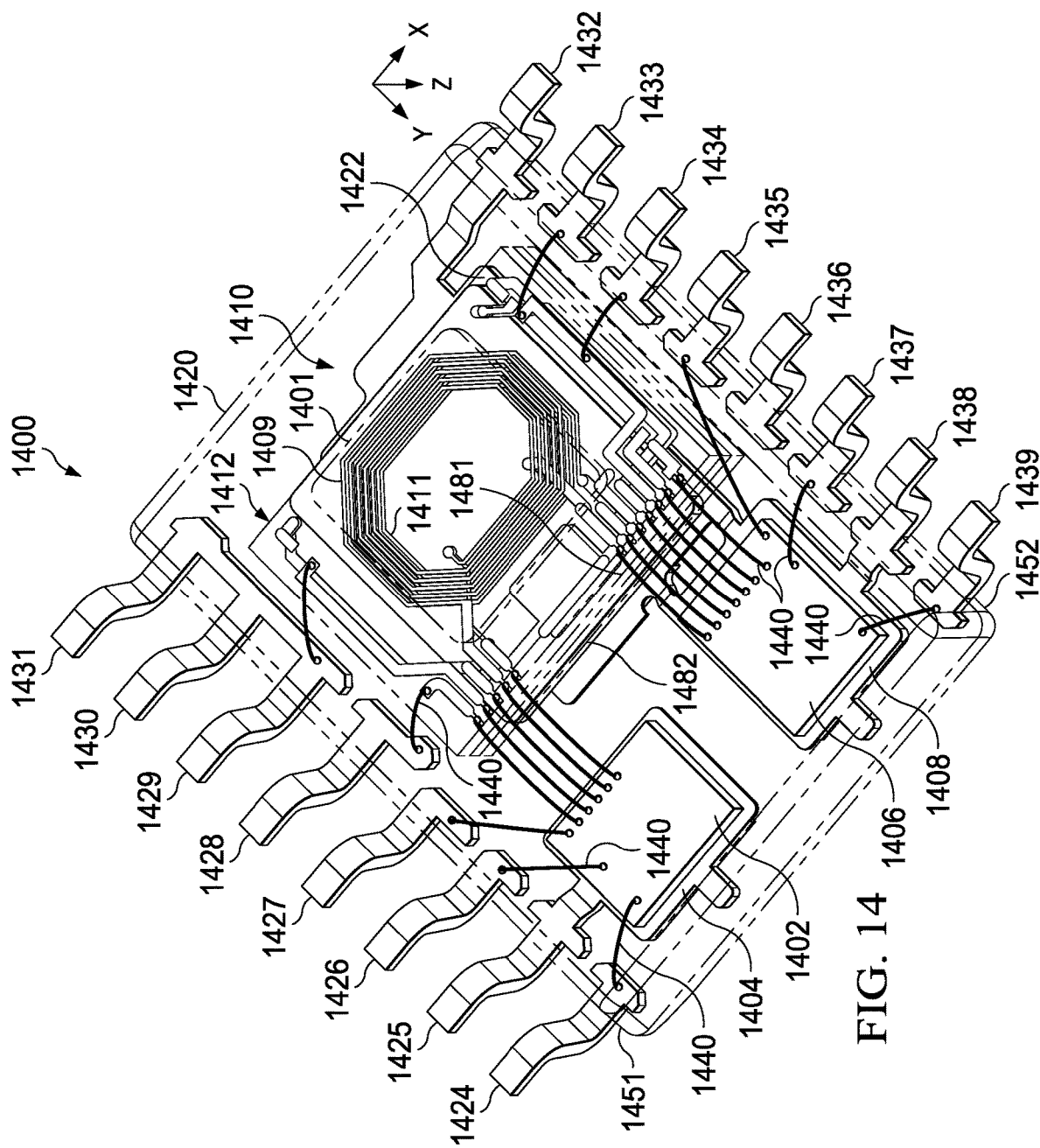
FIG. 14 is a bottom perspective view of a packaged electronic device that includes a multilayer metallization structure of a semiconductor die with a magnetic assembly having coil windings and high permittivity layers.
Figure 14B:
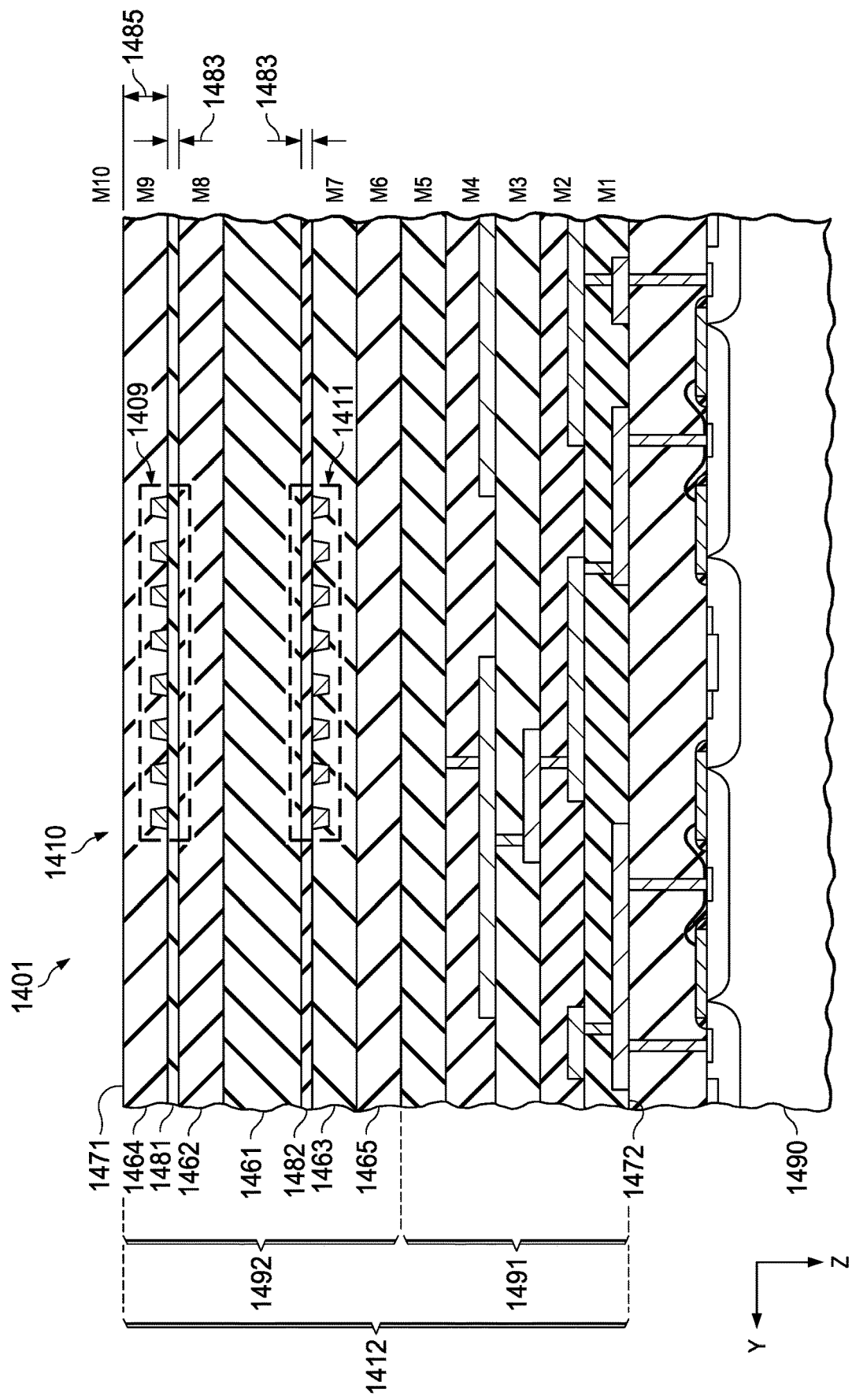
FIG. 14B is a partial sectional end view of the magnetic assembly taken along line 14B-14B of FIG. 14A.
Figure 15:
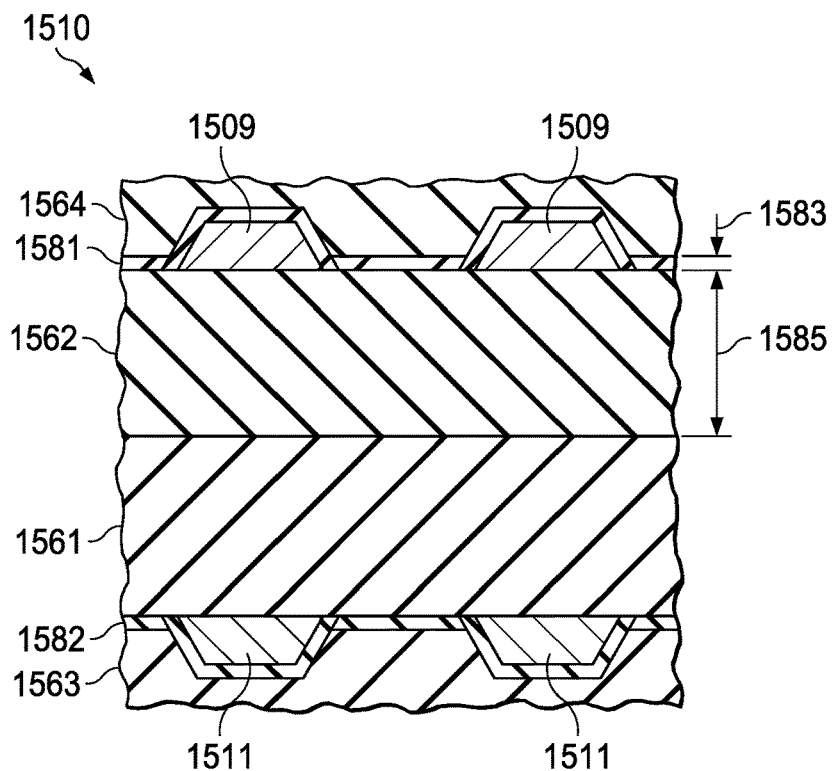
FIG. 15 is a partial sectional side elevation view of another multilayer laminate stack having coil windings and high permittivity layers conformally coated on the coil windings.

Referring to FIGS. 14-14B, in another implementation, the magnetic assembly is fabricated at 201 in FIG. 2 as part of a multilevel metallization structure of a semiconductor die, for example, including capacitor plates, inductor or transformer windings, etc. FIG. 14 shows a bottom perspective view of a packaged electronic device 1400 with magnetic assembly in a multilevel metallization structure of a semiconductor die having coil windings and high permittivity layers. FIG. 14A shows a bottom perspective view of the magnetic assembly of FIG. 14, and FIG. 14B is a partial sectional end view of the magnetic assembly taken along line 14B-14B of FIG. 14A. The integrated magnetic assembly facilitates small form factor integrated electronic devices with high voltage isolation for automotive, industrial or other applications in which voltage isolation and small device size are important. The magnetic assembly solution can be used in products having symmetric or asymmetric magnetic assembly positioning and provides a scalable solution to accommodate designs with differing electric field levels, efficiency and/or EMI performance specifications. The integrated magnetic assembly can be provided in one or more layers or levels of the multilevel metallization structure and operate to reduce the overall internal field strength within desired design specifications to mitigate undesired stress within the semiconductor die barrier and premature device failure for integrated isolated power products in one example.

The example electronic device 1400 has a small outline integrated circuit (SOIC) package type with gull wing leads on opposite first and second sides spaced from one another along a first direction labelled "X" in the drawings. Other packaged electronic devices can be provided in different implementations, including conductive features that can be soldered to another structure or structures for electrical interconnections, such as so called leadless package types (e.g., flat no-leads packages such as quad-flat no-leads (QFN), dual-flat no-leads (DFN), micro lead frame (MLF) and small-outline no leads (SON) types with planar conductive leads such as perimeter lands on the package bottom and/or side that provide electrical connections to a printed circuit board (PCB). In other examples, the device 1400 includes a ball grid array (BGA) package or a land grid array (LGA) type, such as a mold array process ball grid array (MAPBGA) or an over-molded BGA (e.g., plastic BGA or PBGA).

The electronic device 1400 of FIGS. 14-14B provides electrical interconnections for first and second electrical circuits, some or all of which are implemented using bond wires. In other implementations, different forms of interconnection types can be used, including substrate-based interconnections (BGA, LGA, etc.), and which a substrate includes electrical interconnections and signal routing structures (e.g., copper or aluminum traces on one or more layers or levels) alone or in combination with bond wire electrical connections. As shown in FIG. 14, the example device 1400 includes conductive features (e.g., conductive die attach pads or supports) for mounting and supporting first and second semiconductor dies, and a third semiconductor die 1401 that includes a magnetic assembly in a multilevel metallization structure. The third semiconductor die 1401 in one example includes one or more components formed on or in the semiconductor die. In another example, the third semiconductor die 1401 does not include any components on or in the semiconductor die, and only includes the magnetic circuit components of the metallization structure. The die attach pads and device leads can include any suitable conductive structures, such as copper, aluminum, etc. The example device 1400 in FIG. 14 includes a first semiconductor die 1402 attached to a first conductive die attach pad 1404 of a starting lead frame assembly. The device 1400 also includes a second semiconductor die 1406 attached to a second conductive die attach pad 1408.

The electronic device 1400 includes a first circuit associated with a first voltage domain (e.g., a high voltage primary circuit of an integrated power device) as well as a second circuit associated with a second voltage domain (e.g., an isolated lower voltage secondary circuit). The third semiconductor die 1401 includes a first patterned conductive feature 1409 with multiple turns in a magnetic assembly 1410 to form a first winding (e.g., a primary winding of an isolation transformer of the first circuit). The second circuit in this example includes a secondary winding formed by a second patterned conductive feature 1411 (also referred to as a second winding) of the magnetic assembly 1410. The magnetic assembly 1410 includes a multilevel metallization structure 1412 having the first and second patterned conductive features 1409 and 1411. The first and second patterned conductive features 1409 and 1411 each have multiple turns to form respective first and second windings that extend in respective planes of orthogonal first and second directions X and Y in the position illustrated in the figures.

The electronic device 1400 can also include one or more core structures made of ferrous material (not shown), for example, attached to a top side of the third semiconductor die 1401, to facilitate forming a magnetic circuit in combination with the patterned conductive features 1409 and 1411 of the third semiconductor die 1401.

The packaged electronic device 1400 also includes a package structure 1420 that encloses the conductive die attach pads 1404 and 1408, the semiconductor dies 1401, 1402 and 1406, the magnetic assembly 1410, and portions of conductive leads of the device 1400. In one example, the package structure 1420 is or includes a molded material, such as plastic. In another example, the package structure 1420 is or includes a ceramic material. The third semiconductor die 1401 and the included magnetic assembly 1410 is attached to a support structure 1422 that is integral to the second conductive die attach pad 1408. In another implementation, the third semiconductor die 1401 is mounted to a support structure (not shown) that is separated and spaced apart from the first and second die attach pads 1404 and 1408. The packaged electronic device 1400 has conductive gull-wing shaped leads 1424-1431 along one side of the device 1400, as well as conductive gull-wing shaped leads 1432-1439 along an opposite side.

The packaged electronic device also includes bond wires 1440. A first set of the bond wires 1440 interconnects certain of the leads 1424-1431, the primary winding of the magnetic assembly 1410 and the first semiconductor die 1402 and the third semiconductor die 1401 in a first circuit. A second set of the bond wires 1440 interconnects certain of the leads 1432-1439, the secondary winding of the magnetic assembly 1410, the second semiconductor die 1406 and the third semiconductor die 1401 in a second circuit.

As best shown in FIG. 14, the first conductive die attach pad 1404 is directly coupled to a single first lead 1425. In other examples, the die attach pad 1404 is directly coupled to multiple conductive first leads. In the example device 1400, the die attach pad 1404 and the lead 1425 are a single continuous metal structure, such as copper or aluminum. The second conductive die attach pad 1408 is directly coupled to a single lead 1438, and the connected support structure 1422 is directly connected to a single lead 1432. In other examples, the second die attach pad 1408 and/or the support structure 1422 is/are directly coupled to multiple conductive leads. In the example device 1400, the second die attach pad 1408, the support structure 1422, and the leads 1432 and 1438 are a single continuous metal structure, such as copper or aluminum. The package structure 1420 encloses the die attach pads 1404 and 1408, and the associated support structure 1422. Also, the package structure 1420 encloses inner portions of the conductive leads 1424-1439. The conductive leads 1424-1439 in one example are gull wing leads that extend downward and outward from the package structure 1420. Different types and shapes of conductive leads can be used in other examples (e.g., J leads).

As best shown in FIG. 14, the package structure 1420 has respective first and second sides 1451 and 1452 spaced apart from one another along the first direction (e.g., the X direction). The first conductive leads 1424-1431 are located along, and extend outward from, the first side 1451 of the package structure 1420. The second conductive leads 1432-1439 are located along, and extend outward from, the second side 1452 of the package structure 1420.

As shown in the sectional view of FIG. 14B, the magnetic assembly 1410 includes the multilevel metallization structure 1412 having a core dielectric layer 1461 and dielectric metallization structure stack layers 1462, 1463, 1464 and

1465. The core dielectric layer 1461 and the dielectric stack layers 1462-1465 are or include electrically insulating dielectric material, such as silicon dioxide (SiO$_2$), having a first relative permittivity. The example multilevel metallization structure 1412 includes metal layers indicated as M6, M7, M8, M9 and M10 in FIG. 14B. The layers M1-M10 individually include a dielectric stack layer and some or all include patterned conductive features formed by suitable single or dual damascene processes or other processes used in metallization during wafer processing. The thickness and material of the core dielectric layer 1461 provides a withstanding voltage according to a desired voltage separation between the first and second circuits for a given design.

The conductive features 1409 and 1411 are formed in one or more of the metal layers M6, M7, M8, M9, and M10 or between respective ones or pairs of the dielectric stack layers 1462-1465 and/or the core dielectric layer 1461. The core dielectric layer 1461 and the dielectric stack layers 1462-1465 extend in respective planes of the first and second directions X, Y and are stacked along the third direction Z as best shown in the sectional view of FIG. 14B. The core dielectric layer 1461 in one example provides an electrical isolation barrier between the first or primary circuit and an associated first voltage domain, and the second or secondary circuit operating at an associated second voltage domain. The multilevel metallization structure 1412 also has one or more conductive vias providing electrical interconnection for routing signals between two or more of the six metal layers M1-M6.

As shown in FIG. 14B, the multilevel metallization structure 1412 has a Z-direction stack of metal levels M1-M10 formed on or in or between individual ones of the core dielectric layer 1461 and the dielectric stack layers 1462-1465. The first patterned conductive feature 1409 includes multiple turns in the metal layer M10 to form the first winding, and the second patterned conductive feature 1411 has multiple turns in the metal layer M8. The first and second windings in this example are on opposite sides of the core dielectric layer 1461. In this example, the first patterned conductive feature 1409 is formed in the second metal layer M8 above the core level 1461 in layer M8, and the core dielectric layer 1461 is positioned between the first and second patterned conductive features 1409 and 1411 along the third direction Z. In other examples, more or fewer dielectric stack layers 1461-1465 can be provided, and more or fewer metal layers can be used.

As further shown in FIG. 14A, the multilevel metallization structure 1412 has a first or bottom side 1471 on a top side of a processed semiconductor die 1490, a second or top side 1472 spaced apart from one another along the third direction Z, lateral sides 1473 and 1474 spaced apart from one another along the first direction X, and lateral sides 1475 and 1476 spaced apart from one another along the second direction Y.

The multilevel metallization structure 1412 has first and second high permittivity dielectric layers 1481 and 1482. The first high permittivity dielectric layer 1481 extends between, and contacts, the first patterned conductive feature 1409 and one of the dielectric stack layers 1462. The second high permittivity dielectric layer 1482 extends between, and contacts, the second patterned conductive feature 1411 and the core dielectric layer 1461. The first and second high permittivity dielectric layers 1481 and 1482 have a second relative permittivity that is at least 1.5 times the first relative permittivity of the dielectric stack layers 1462-1465. The first and second high permittivity dielectric layers 1481 and 1482 help to smooth the electric field around the conductors of the conductive features 1409 and 1411 in operation when the electronic device 1400 is powered and operating. In one example, the second relative permittivity is 6 or more and 500 or less, such as 10 or more and 20 or less. As shown in FIG. 14B, the individual high permittivity dielectric layers 1481 and 1482 have a minimum thickness 1483 along the third direction Z, for example, 5 um of more and 20 um or less. The individual dielectric stack layers 1461-1465 have thicknesses 1485 that are more than 3 times the thickness 1483 of the first and second high permittivity dielectric layers 1481 and 1482.

In one implementation, the high permittivity dielectric layers 1481 and 1482 are or include one or more of hafnium oxide (e.g., HFO$_2$), titanium dioxide (e.g., TiO$_2$), aluminum oxide (e.g., Al$_2$O$_3$), or zirconium dioxide (e.g., ZrO$_2$) of any suitable stoichiometry. The semiconductor die 1490 in one example is or includes silicon or other semiconductor material, and may include one or more electronic components or circuits, such as transistors, resistors, capacitors, etc. The first five metallization layers M1-M5 in this example are used for signal routing and interconnection of features and/or components of the semiconductor die 1490 in a first (e.g., lower) portion 1491 of the metallization structure 1412. The remaining metallization layers M6-M10 include conductive features of the first and second magnetic circuits that form a second (e.g., upper) portion 1492 of the multilevel metallization structure 1412. For example, the voltage of the first patterned conductive feature 1409 and metal structures above the core dielectric layer 1461 can be much higher than the voltage of the second patterned conductive feature 1414 and other metal structures below the isolation boundary of the core dielectric layer 1461. In another example, a metallization structure of a semiconductor die includes a multilevel metallization structure with a magnetic assembly having coil windings, capacitor plates and via connections.

The disclosed apparatus and techniques facilitate operation without device degradation or damage while allowing operation at potentially high voltage differences between first and second circuits within the packaged electronic devices 100, 1400, without increasing the size of the magnetic assembly 110, 1410, and mitigating voltage breakdown and reducing the stressed volume of the layers of the lamination structure 112.

Referring now to FIGS. 15-17B, FIG. 15 shows a partial sectional side elevation view of another multilayer laminate stack 1510 having first and second conductive features that form coil winding patterned conductive features 1509 and 1511 and high permittivity layers conformally coated on the coil windings. FIGS. 16 and 16A are partial sectional side elevation views 1600 that show simulated electric fields in a baseline example of the multilayer laminate stack 1510, and FIGS. 17 and 17A show partial sectional side elevation views 1700 of simulated electric fields in another example of the multilayer laminate stack 1510.

The illustrated portion includes patterned conductive features 1509 and 1511, a dielectric core layer 1561 and dielectric stack layers 1562, 1562, 1564, and 1565 similar to the respective structures and features 109, 111, and 161-165 as described above. This example also includes first and second high permittivity layers 1581 and 1582 that are conformally coated on the coil winding patterned conductive features 1509 and 1511. The individual high permittivity dielectric layers 1581 and 1582 have a minimum thickness 1583 along the third direction Z, for example, 5 um of more and 20 um or less. The individual dielectric stack layers 1561-1565 have thicknesses 1585 that are more than 3 times the thickness 1583 of the first and second high permittivity dielectric layers 1581 and 1582. The high permittivity dielectric layers 1581 and 1582 in one example are or include a polymeric material used in laminates, such BT resin having filler particles. In one example, the filler particles are or include aluminum oxide (e.g., $Al_2O_3$) of any suitable stoichiometry. In this or another example, the filler particles are or include zirconium dioxide (e.g., $ZrO_2$) of any suitable stoichiometry. In these or another example, the filler particles are or include barium titanate (e.g., BTO) of any suitable stoichiometry. In these or another example, the filler particles are or include barium zirconate (e.g., BZO) of any suitable stoichiometry. In these or another example, the filler particles are or include hafnium oxide (e.g., $HFO_2$) of any suitable stoichiometry.

The simulated electric fields in FIGS. 16 and 16A exhibit relatively high magnitude (e.g., E less than $5 \times E_0$) near a corner 1601 of one of the patterned conductive features 1509 for baseline dielectric layers 1581 and 1582 having a relative permittivity less than 6. For the same simulated conditions, FIGS. 17 and 17A using another implementation of the dielectric layers 1581 and 1582 having a thickness 1583 of 5 um and relative permittivity of 15, the electric field strength at the corner 1601 is significantly reduced.

FIG. 18 shows a graph 1800 of stressed volume ($S_V$ in $m^3$) as a function of applied electric field strength ($E/E_0$) with a curve 1801 for the baseline dielectric layers 1581 and 1582 having a relative permittivity less than 6, and curves 1802-1805 for four other example high permittivity dielectric layers 1581 and 1582 with relative permittivity of 6 or more and thicknesses 1583 of over 1 um, over 5 um, under 1 um, and under 5 um, respectively.

FIG. 19 shows a graph 1900 of stressed volume change (|dSV/dE| in V/um) as a function of applied electric field strength ($E/E_0$) with a curve 1901 for the baseline dielectric layers 1581 and 1582 having a relative permittivity less than 6, and curves 1902-1905 for four other example high permittivity dielectric layers 1581 and 1582 with relative permittivity of 6 or more and thicknesses 1583 of over 1 um, over 5 um, under 1 um, and under 5 um, respectively. The tail generated in FIGS. 18 and 19 indicate that the high permittivity material applied under the conductors is not providing significant help with different thicknesses of the film. While the material applied over the conductor provides a better solution since thickness of the material further decreases the maximum electric field estimated in the laminate stack. The peaks in the electric field spectrum of FIG. 19 is due to the presence of two different laminate materials in the laminate stack (core and stack (e.g., prepreg) dielectric layers).

Figure 20:
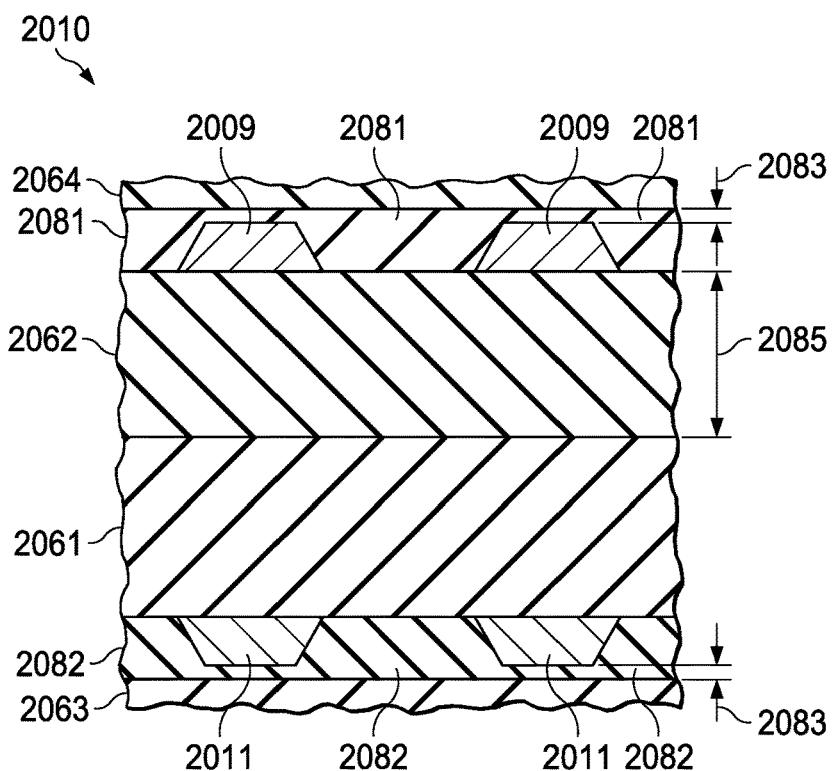
FIG. 20 is a partial sectional side elevation view of another multilayer laminate stack having coil windings and high permittivity layers non-conformally coated on the coil windings.

FIG. 20 shows a partial sectional side elevation view of another multilayer laminate stack 2010 having first and second conductive features that form coil winding patterned conductive features 2009 and 2011 and high permittivity layers conformally coated on the coil windings. The illustrated portion includes patterned conductive features 2009 and 2011, a dielectric core layer 2061 and dielectric stack layers 2061, 2062, 2063, and 2064 similar to the respective structures and features 109, 111, and 161-165 as described above. This example also includes first and second high permittivity layers 2081 and 2082 that are non-conformally coated on the coil winding patterned conductive features 2009 and 2011, for example, by dispensing, printing, spraying, silk screening or other suitable deposition following by squeegee or other planarizing, to form the respective layers 2081 and 2081 as or including BT resin having filler particles, where the filler particles are or include one or more of aluminum oxide, zirconium dioxide, barium titanate, barium zirconate (e.g., BZO), and hafnium oxide (e.g., $HFO_2$) of any suitable stoichiometry, as described above.

The individual high permittivity dielectric layers 2081 and 2082 in this example have a minimum thickness 2083 along the third direction Z, for example, 5 um of more and 20 um or less. The individual dielectric stack layers 2061-2064 have thicknesses 2085 that are more than 3 times the thickness 2083 of the first and second high permittivity dielectric layers 2081 and 2082. The high permittivity dielectric layers 2081 and 2082 in one example are or include a polymeric material used in laminates, such BT resin having filler particles. In one example, the filler particles are or include aluminum oxide (e.g., $Al_2O_3$) of any suitable stoichiometry. In this or another example, the filler particles are or include zirconium dioxide (e.g., $ZrO_2$) of any suitable stoichiometry. In these or another example, the filler particles are or include barium titanate (e.g., BTO) of any suitable stoichiometry. In these or another example, the filler particles are or include barium zirconate (e.g., BZO) of any suitable stoichiometry. In these or another example, the filler particles are or include hafnium oxide (e.g., $HFO_2$) of any suitable stoichiometry.

In certain implementations, employing thin high relative permittivity materials in contact with conductors solves the problem of high electric fields at the edges of conductors because high voltage differences exist between different voltage nodes during powered device operation. Described examples provide solutions to dielectric breakdown or degradation for high voltage circuit applications without increasing device size using high relative dielectric permittivity layers using material solutions in contact with metal structures to decrease the electric field in the device and to smooth the electric field around the conductors. Example materials include high permittivity fillers for laminate and high permittivity metal-oxides, ceramics, etc. The benefits of reduction in electric field increase product lifetime and yield, and illustrated examples show better electric field distributions than the current solutions. In alternate implementations, the high permittivity material can be provided over as a prepreg or core material films either on both sides or on one side (over conductor solution). The high permittivity film can also be a free-standing layer which can be laminated during lamination process independent of the prepreg and core layers. The proposed materials can also be formulated as build-up materials, such as MJ1 ABF routable lead frame (RLF) dielectric material or the like. Moreover, as shown in FIGS. 14-14B, the solution is applicable to silicon designs.

Modifications are possible in the described examples, and other implementations are possible, within the scope of the claims.

What is claimed is:

1. An electronic device, comprising:
   a package structure; and
   a magnetic assembly in the package structure, the magnetic assembly including a multilevel lamination or metallization structure having a core dielectric layer, dielectric stack layers, a high permittivity dielectric layer, and conductive features;
   the core dielectric layer and the dielectric stack layers extending in respective planes of orthogonal first and second directions and stacked along a third direction that is orthogonal to the first and second directions, and the dielectric stack layers having a first relative permittivity;

the conductive features formed in metal layers on or between respective ones or pairs of the dielectric stack layers, and the conductive features including first and second patterned conductive features; and the high permittivity dielectric layer extending between and contacting the first patterned conductive feature and one of the dielectric stack layers or the core dielectric layer, the high permittivity dielectric layer having a second relative permittivity, and the second relative permittivity being at least 1.5 times the first relative permittivity.

2. The electronic device of claim 1, wherein the second relative permittivity is 6 or more and 500 or less.

3. The electronic device of claim 2, wherein the second relative permittivity is 10 or more and 20 or less.

4. The electronic device of claim 1, wherein the high permittivity dielectric layer has a minimum thickness along the third direction of 5 um of more and 20 um or less.

5. The electronic device of claim 1, wherein the magnetic assembly includes a second high permittivity dielectric layer extending between and contacting the second patterned conductive feature and another one of the dielectric stack layers or the core dielectric layer, the second high permittivity dielectric layer having the second relative permittivity.

6. The electronic device of claim 5, wherein:
the first patterned conductive feature has multiple turns to form a first winding;
the second patterned conductive feature has multiple turns to form a second winding, and
the core dielectric layer is positioned between the first and second patterned conductive features along the third direction.

7. The electronic device of claim 1, wherein the magnetic assembly includes a multilevel lamination structure.

8. The electronic device of claim 1, wherein the high permittivity dielectric layer includes a polymeric material having filler particles, and the filler particles include aluminum oxide, zirconium dioxide, barium titanate, barium zirconate, or hafnium oxide.

9. The electronic device of claim 1, wherein the magnetic assembly includes a multilevel metallization structure of a semiconductor die.

10. The electronic device of claim 8, wherein the high permittivity dielectric layer includes hafnium oxide, titanium dioxide, aluminum oxide, or zirconium dioxide.

11. The electronic device of claim 1, wherein:
the first patterned conductive feature has multiple turns to form a first winding;
the second patterned conductive feature has multiple turns to form a second winding, and
the core dielectric layer is positioned between the first and second patterned conductive features along the third direction.

12. A magnetic assembly, comprising:
a multilevel lamination or metallization structure having a core dielectric layer, dielectric stack layers, a high permittivity dielectric layer, and conductive features;
the core dielectric layer and the dielectric stack layers extending in respective planes of orthogonal first and second directions and stacked along a third direction that is orthogonal to the first and second directions, and the dielectric stack layers having a first relative permittivity;
the conductive features formed in metal layers on or between respective ones or pairs of the dielectric stack layers, and the conductive features including first and second patterned conductive features; and
the high permittivity dielectric layer extending between and contacting the first patterned conductive feature and one of the dielectric stack layers or the core dielectric layer, the high permittivity dielectric layer having a second relative permittivity, and the second relative permittivity being at least 1.5 times the first relative permittivity.

13. The magnetic assembly of claim 12, wherein the second relative permittivity is 6 or more and 500 or less.

14. The magnetic assembly of claim 13, wherein the second relative permittivity is 10 or more and 20 or less.

15. The magnetic assembly of claim 12, wherein the high permittivity dielectric layer has a minimum thickness along the third direction of 5 um of more and 20 um or less.

16. The magnetic assembly of claim 12, further comprising a second high permittivity dielectric layer extending between and contacting the second patterned conductive feature and another one of the dielectric stack layers or the core dielectric layer, the second high permittivity dielectric layer having the second relative permittivity.

17. The magnetic assembly of claim 12, wherein the high permittivity dielectric layer includes a polymeric material having filler particles, and the filler particles include aluminum oxide, zirconium dioxide, barium titanate, barium zirconate, or hafnium oxide.

* * * * *